(12) United States Patent
Kung et al.

(10) Patent No.: US 6,420,732 B1
(45) Date of Patent: Jul. 16, 2002

(54) LIGHT EMITTING DIODE OF IMPROVED CURRENT BLOCKING AND LIGHT EXTRACTION STRUCTURE

(75) Inventors: Hsing Kung, Los Altos Hills, CA (US); Mark Devito, Vancouver, WA (US); Chin-Wang Tu, Cupertino, CA (US)

(73) Assignee: Luxnet COrporation, Fremont, CA (US)

( * ) Notice: Subject to any disclaimer, the term of this patent is extended or adjusted under 35 U.S.C. 154(b) by 18 days.

(21) Appl. No.: 09/604,546

(22) Filed: Jun. 26, 2000

(51) Int. Cl.$^7$ .............................................. H01L 27/15
(52) U.S. Cl. .............................. 257/79; 257/85; 438/22
(58) Field of Search .............................. 257/14, 79, 85, 257/96, 94, 98, 99, 103

(56) References Cited

U.S. PATENT DOCUMENTS

| | | | |
|---|---|---|---|
| 4,152,044 A | 5/1979 | Liu | 350/96.12 |
| 5,048,035 A | 9/1991 | Sugawara et al. | 372/45 |
| 5,076,860 A | 12/1991 | Ohba et al. | 148/33.1 |

(List continued on next page.)

FOREIGN PATENT DOCUMENTS

| | | | |
|---|---|---|---|
| EP | 0 702 414 A2 | 3/1996 | H01L/33/00 |
| JP | 56 145714 | 11/1981 | H02H/3/00 |
| JP | 3 291632 | 12/1991 | G02F/1/1337 |
| JP | 4 244281 | 9/1992 | B08B/3/08 |
| JP | 9 199159 | 7/1997 | H01M/10/24 |

OTHER PUBLICATIONS

Itaya et al., "High–Brightness inGaAip Green Light–Emitting Diodes", Aug. 10, 1992, American Institute of Physics.
Wheeler et al., "Monolithic Integration of GaAs Optoelectronic Devices Using Thermal Oxide Isolation (TOI)" Department of Electrical Engineering, 1997.
Fukunda et al., "Light–Emission–and–Detection (LEAD) Diodes with Semi–Insulting Buried Heterostructure", Sep. 1, 1994, Electronic Letters.

(List continued on next page.)

*Primary Examiner*—David Nelms
*Assistant Examiner*—Andy Huynh
(74) *Attorney, Agent, or Firm*—Michael A. Glenn; Don Hendricks

(57) ABSTRACT

Structures for light emitting diodes are disclosed, which include improved current blocking and light extraction structures. The diodes typically include a substrate formed on a first electrode, a first confining layer of a first conductivity type formed on the substrate, an active region formed on the first confining layer, a second confining layer of a second conductivity type formed on the active region, and a window layer of the second conductivity type formed on the second confining layer. A contact layer of the second conductivity type is formed on the window layer for making ohmic contact, a conductive oxide layer is formed on the contact layer, and a second electrode is formed on the conductive oxide layer. The conductive oxide layer typically includes a central portion located below the second top electrode, which extends into the LED structure, typically beyond the contact layer and into the window layer, or even beyond the window layer, such as into the second confining layer. The improved LED structures preferably include a higher resistive or reverse biased pattern, typically built on or within the substrate, approximately below the second electrode, to further assist the current blocking function. The light emitting diodes preferably include one or more holes which are defined in the conductive oxide layer, or within both the conductive oxide layer and the contact layer, to promote the transmission of light from the upper surface of the light emitting diode. A Distributed Bragg Reflector is also preferably provided between the lower substrate and the first confining layer, to reduce light absorption within the substrate, and to promote efficient light extraction from the top of the LED structure.

57 Claims, 12 Drawing Sheets

U.S. PATENT DOCUMENTS

| | | | |
|---|---|---|---|
| 5,153,889 A | 10/1992 | Sugaware et al. | 372/45 |
| 5,192,985 A | 3/1993 | Abe | 257/13 |
| 5,226,053 A | 7/1993 | Cho et al. | 372/45 |
| 5,345,092 A | 9/1994 | Kurihara | 257/13 |
| 5,488,233 A | 1/1996 | Ishikawa et al. | 257/94 |
| 5,502,316 A | 3/1996 | Kish et al. | 257/94 |
| 5,724,376 A | 3/1998 | Kish, Jr. et al. | 372/96 |
| 5,789,768 A * | 8/1998 | Lee et al. | 257/96 |
| 5,811,839 A | 9/1998 | Shimoyama et al. | 257/94 |
| 5,821,569 A * | 10/1998 | Dutta | 257/96 |
| 5,837,561 A | 11/1998 | Kish, Jr. et al. | 438/47 |
| 5,861,636 A * | 1/1999 | Dutta et al. | 257/91 |
| 5,917,201 A | 6/1999 | Ming-Jiunn et al. | 257/94 |
| 5,972,731 A * | 10/1999 | Dutta | 438/39 |
| 6,063,643 A * | 5/2000 | Dutta | 438/39 |
| 6,222,868 B1 * | 4/2001 | Ouchi et al. | 372/50 |
| 6,225,648 B1 * | 5/2001 | Hsieh et al. | 257/95 |

OTHER PUBLICATIONS

Yamada et al. "Light Emitting Diodes in Long Wavelength Region", Jan. 29, 1992, Shimadzu Journal.

Noguchi, "Ultra–High–Brightness InGaAIP–LED Lamps", 1993, InGaAIP–LED.

* cited by examiner

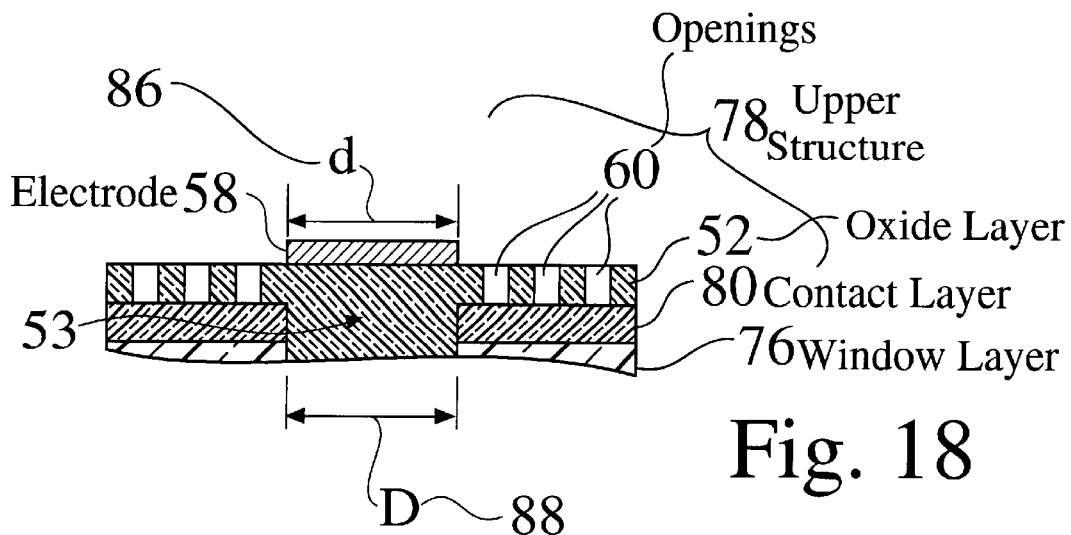
Fig. 18
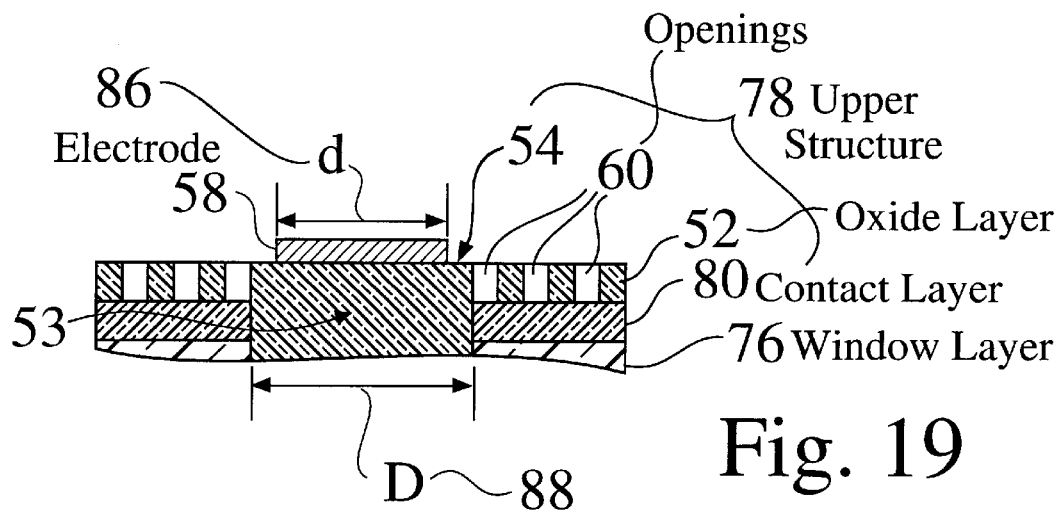
Fig. 19
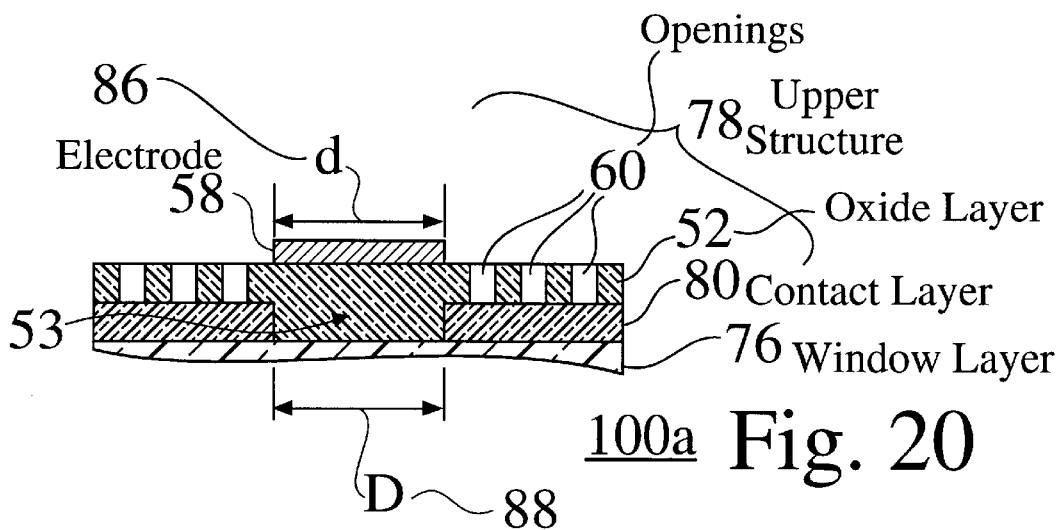
100a Fig. 20

LIGHT EMITTING DIODE OF IMPROVED CURRENT BLOCKING AND LIGHT EXTRACTION STRUCTURE

FIELD OF THE INVENTION

The invention relates to the field of light emitting diodes. More particularly, the invention relates to light emitting diode structures which provide improved current blocking and/or light extraction properties.

BACKGROUND OF THE INVENTION

AlInGaP alloys have been used for making bright light emitting diodes (LEDs), wherein the light wavelength produced by an AlInGaP alloy LED is determined by the aluminum to gallium ratio of the alloy within the active region of the LED. The wavelength produced by an AlInGaP alloy LED is typically varied, from about 550 nanometers to about 680 nanometers.

A conventional AlInGaP LED typically contains a double heterostructure AlInGaP device, in which a first confining layer, such as an n-type AlInGaP, is formed on an n-type substrate, such as GaAs. An active layer or region of undoped. AlInGaP is then formed on the first layer, and a p-type AlInGaP confining layer is formed upon the active layer. Metalorganic vapor phase epitaxy (MOVPE) processes are typically used to grow the AlInGaP substrates for this double heterostructure device.

Various light emitting diodes have been disclosed in the prior art, which describe various LED structures, materials, and manufacturing processes. N. Hosoi, K. Fujii, A. Yamauchi, H. Gotoh, and Y. Sato, *Semiconductor Light Emitting Devices,* European Patent Application No. EP 0 702 414 A2 (filed Jan. 9, 1995) disclose various semiconductor light emitting device structures.

A. Dutta, *Surface-Emission Type Light-Emitting Diode and Fabricating process Therefor* U.S. Pat. No. 5,972,731 (Oct. 26, 1999), and U.S. Pat. No. 5,821,569 (Oct. 13, 1998), discloses "An n-type GaAs layer as a buffer layer, an n-type $(Al_{0.7}Ga_{0.3})_{0.5}In_{0.5}P$ layer, an active layer, a p-type $(Al_{0.7}Ga_{0.3})_{0.5}In_{0.5}P$ layer, a thin layer of $Al_xGa_{1-x}As$ layer ($x \geq 0.9$), an $Al_{0.7}Ga_{0.3}As$ layer as a current spreading layer and a high doped p-type GaAs cap layer are sequentially grown on an n-type GaAs layer of a substrate. As the active layer, an $(Al_xGa_{1-x})_{0.5}In_{0.5}P$ based bulk or multi-quantum well is employed. As the current spreading layer, an $Al_xGa1-xAs$ ($x \geq 0.7$) is employed. The current spreading layer is a p-type III–IV compound semiconductor having wider band gap than a band gap of a material used for forming the active layer, and being established a lattice matching with the lower layer. After mesa etching up to the cladding layer, growth of selective oxide is performed at a part of the AlGaAs layer. By this, a block layer (selective oxide of AlGaAs) is formed. By this blocking layer, a light output power and a coupling efficiency are improved".

K. Shimoyama, N. Hosoi, K. Fujii, A. Yamauchi, H. Gotoh and Y. Sato, *Semiconductor Light-Emitting Devices,* U.S. Pat. No. 5,811,839 (Sep. 22, 1998) disclose "a semiconductor light-emitting device including a first clad layer comprising a first conductive type of AlGaAsP compound, a second clad layer that is located next to the first clad layer, comprises a first conductive type of AlGaInP compound and has a thickness of up to 0.5 µm, an active layer that is located next to the second clad layer and comprises a first or second conductive type AlGaInP or GaInP, a third clad layer that is located next to the active layer, comprises a second conductive type of AlGaInP compound and has a thickness of up to 0.5 µm, and a fourth clad layer that is located next to the third clad layer and comprises a second conductive type of AlGaAsP compound, and/or a light-extracting layer that comprises a second conductive type AlGaP or GaP and has a thickness of 1 µm to 100 µm."

H. Sugawara, M. Ishikawa, Y. Kokubun, Y. Nishikawa, S. Naritsuka, K. ltaya, G. Hatakoshi, and M. Suzuki, *Semiconductor Light Emitting Device,* U.S. Pat. No. 5,153,889 (Oct. 6, 1992) disclose "a semiconductor light emitting device, comprising a semiconductor substrate, a double hetero structure portion formed on the front surface of the substrate and consisting of an InGaAlP active layer and lower and upper clad layers having the active layer sandwiched therebetween, a first electrode formed in a part of the surface of the double hetero structure portion, and a second electrode formed on the back surface of the substrate. A current diffusion layer formed of GaAlAs is interposed between the double hetero structure portion and the first electrode, said current diffusion layer having a thickness of 5 to 30 microns and a carrier concentration of $5 \times 10^{17}$ cm$^{-3}$ to $5 \times 10^{18}$ cm$^{-3}$."

J. Ming-Jiunn, B. Lee, and J. Tarn, *Light Emitting Diode With Asymmetrical Energy Band Structure,* U.S. Pat. No. 5,917,201 (Jun. 29, 1999) disclose a high bandgap material "used as a cladding layer to confine the carrier overflow in a aluminum-gallium-indium-phosphide light emitting diode. The quantum efficiency is improved. The use of this high bandgap material as a window material also prevents current crowding. The efficiency can further be improved by using a Distributed Bragg Reflector in the structure to reflect light, and a buffer layer to reduce interface dislocation."

Y. Liu, *Gallium Aluminum Arsenide Graded Index Waveguide,* U.S. Pat. No. 4,152,044 (May 1, 1979) discloses a "double heterostructure light emitting device has a graded index optical waveguide formed integrally therein. The integrally formed waveguide collects light from the heterojunction and directs the light in a distinct light pattern on one surface of the device. The rate of variation of the index gradient within the waveguide region determines the geometry of the light pattern. The light output pattern can be conveniently tailored to match the geometry of a wide variety of optical fiber dimensions".

H. Abe, *Semiconductor Light-Emitting Element with Light-Shielding Film,* U.S. Pat. No. 5,192,985 (Mar. 9, 1993) discloses a semiconductor light-emitting element, which "includes a current pinching type semiconductor light-emitting element main body, which utilizes light extracted from a surface parallel to a light-emitting layer, and a light-shielding film, which is locally or entirely coated on a side surface of the semiconductor light-emitting element main body to be electrically insulated therefrom. A method of manufacturing a semiconductor light-emitting element, includes the steps of preparing a wafer by sequentially stacking and forming a current blocking layer, a first cladding layer, an active layer, a second cladding layer, and a first ohmic electrode on one surface of a substrate, and forming a second ohmic electrode on the other surface of the substrate, forming a resist film on the major surface of the wafer, forming a plurality of grooves reaching at least the first cladding layer at predetermined positions on the resist layer, coating an electrical insulating film on the resist film including the grooves, and coating a light-shielding layer on the electrical insulating film, removing the electrical insulating film, the light-shielding film, and the resist film so as to leave the electrical insulating film and the light-shielding film in portions of the grooves, and cutting the wafer at the portions of the grooves."

A. Cho, E. Schubert, L. Tu, and G. Zydzik, *Light Emitting Diode,* U.S. Pat. No. 5,226,053 (Jul. 6, 1993) disclose an LED in which: "an optical cavity of the LED, which includes an active layer (or region) and confining layers, is within a resonant Fabry-Perot cavity. The LED with the resonant cavity, hereinafter called Resonant Cavity LED or RCLED, has a higher spectral purity and higher light emission intensity relative to conventional LEDs. The Fabry-Perot cavity is formed by a highly reflective multilayer distributed Bragg reflector (DBR) mirror ($R_B \geq 0.99$) and a mirror with a low to moderate reflectivity ($R_T \sim 0.25-0.99$). The DBR mirror, placed in the RCLED structure between the substrate and the confining bottom layer, is used as a bottom mirror. Presence of the less reflective top mirror above the active region leads to an unexpected improvement in directional light emission characteristics. The use of a Fabry-Perot resonant cavity formed by these two mirrors results in optical spontaneous light emission from the active region, which is restricted to the modes of the cavity. While the bottom DBR mirror reduces absorption by the substrate of that light portion which is emitted toward the substrate, the two mirrors of the resonant cavity reduce the isotropic emission and improve the light emission characteristics in terms of a more directed (anisotropic) emission."

H. Kurikawa, *Light Emitting Diode Including Active Layer Having First and Second Active Regions*, U.S. Pat. No. 5,345,092 (Sep. 6, 1994) discloses a "light emitting diode comprises a semiconductor substrate of compound semiconductor, an active layer provided above the semiconductor substrate and including first and second active regions, the first active region being spaced apart from the second active region thereby controlling diffusion of an injected minority carrier in a radial direction, the first active region substantially operating as a light emitting region, and a window for emitting light generated at the first active region."

F. Kish, F. Steranka, D. DeFevere, V. Robbins, and J. Uebbing, *Wafer Bonding of Light Emitting Diode Layers*, U.S. Pat. No. 5,502,316 (Mar. 26, 1996) disclose "A method-of forming a light emitting diode (LED) includes providing a temporary growth substrate that is selected for compatibility with fabricating LED layers having desired mechanical characteristics. For example, lattice matching is an important consideration. LED layers are then grown on the temporary growth substrate. High crystal quality is thereby achieved, whereafter the temporary growth substrate can be removed. A second substrate is bonded to the LED layers utilizing a wafer bonding technique. The second substrate is selected for optical properties, rather than mechanical properties. Preferably, the second substrate is optically transparent and electrically conductive and the wafer bonding technique is carried out to achieve a low resistance interface between the second substrate and the LED layers. Wafer bonding can also be carried out to provide passivation or light-reflection or to define current flow."

Prior Current Spreading Structures

Efficient current spreading is critical to the performance of an LED. It is desirable to have applied current uniformly and quickly spread out over an LED device, before the current reaches the p-n junction. Since the aluminum content is normally high within the second confining layer, the electrical conductivity of the second confining layer is normally low, and it is generally difficult for the current to spread out quickly laterally across the second confining layer.

One common structure by which an applied current may be spread across the surface of an LED device is that of a relatively thick GaP or AlGaAs window layer, located above the double heterostructure (i.e. above the second confining layer), wherein current applied across the upper surface of the LED is spread as it extends downward through the thick window layer, before the current reaches the second confining layer and the p-n junction.

R. Fletcher, C. Kuo, T. Osentowski, and V. Robbins, *Light-Emitting Diode with an Electrically Conductive Window*, U.S. Pat. No. 5,008,718 (Apr. 16, 1991) disclose a light-emitting diode which has "a semiconductor substrate underlying active p-n junction layers of AlGaInP for emitting light. A transparent window layer of semiconductor different from AlGaInP overlies the active layers and has a lower electrical resistivity than the active layers and a bandgap greater than the bandgap of the active layers, for minimizing current crowding from a metal electrical contact over the transparent window layer. The active layers may be epitaxially grown on a temporary GaAs substrate. A layer of lattice mismatched GaP is then grown on the active layers with the GaP having a bandgap greater than the bandgap of the active layers so that it is transparent to light emitted by the LED. The GaAs temporary substrate is then selectively etched away so that the GaP acts as a transparent substrate. A transparent window layer may be epitaxially grown over the active layers on the face previously adjacent to the GaAs substrate."

An alternate structure by which an applied current may be spread across the surface of an LED device is that of a conductive oxide layer, located above the double heterostructure, wherein current applied across the upper surface of the LED is spread laterally across the conductive oxide layer, and then extends downward toward the p-n junction. A contact layer is typically used in conjunction with a conductive oxide layer, to provide ohmic contact between the conductive oxide layer and the underlying LED layers.

M. Jou, C. Chang, B. Lee, and J. Lin, *Surface Light Emitting Diode with Electrically Conductive Window Layer*, U.S. Pat. No. 5,481,122 (Jan. 2, 1996) disclose a "surface emitting AlGaInP LED having an ITO layer as a window layer to eliminate the current crowding effect, and an ohmic contact layer between its double hetero-structure of AlGaInP and the ITO layer, so that ITO can be utilized with the double hetero-structure of AlGaInP."

While it is generally desirable to have applied current uniformly and quickly spread out over the whole LED device, before the current reaches the p-n junction, LED structures typically have the top electrode located in a central region on the upper surface. Current flow which arrives at a region of the p-n junction directly below the electrode produces light which is shadowed by the electrode, resulting in inefficiency. In conventional LED structures, however, the current density is generally higher directly below the electrode. A large portion of the light generated within the p-n junction region under the electrode is then blocked by the electrode, as the generated light is transmitted upward. It would be advantageous to provide improved LED structures which have a greater power efficiency, by which applied current is more uniformly and quickly spread out over the "unshadowed" regions of the p-n junction, while current flow toward the p-n junction region directly under the electrode is reduced.

Prior Current Blocking Structures

Various structures have been disclosed to reduce current flow toward the p-n junction region under the top electrode.

H. Sugawara, M. Ishikawa, Y. Kokubun, Y. Nishikawa, and S. Naritsuka, *Semiconductor Light Emitting Device*, U.S. Pat. No. 5,048,035 (Sep. 10, 1991) disclose a "semiconductor light emitting device, especially, a light emitting diode includes a compound semiconductor substrate of a first conductivity type, an InGaAlP layer formed on the substrate and having a light emitting region, a GaAlAs layer of a second conductivity type formed on the InGaAlP layer and having a larger band gap than that of the InGaAlP layer, and an electrode formed on a part of the GaAlAs layer. The light emitting diode emits light from a surface at the electrode side except for the electrode. A current from the electrode is widely spread by the GaAlAs layer to widely spread a light emitting region." While Sugawara et al. disclose a current blocking AlInGaP structure, the structure requires an extra epitaxial growth, to form the upper blocking region, and requires precise alignment. Such a structure is therefore. more complicated.

FIG. 1 shows a cross-sectional view of a light emitting diode 10 similar to the structure disclosed by Sugawara et al., having a substrate 14a established on a bottom electrode 12a, and a double heterostructure. 22a located on the substrate 14a, wherein the double heterostructure 22a comprises a first cladding layer 16a, an active layer 18a, and a second cladding layer 20a, and wherein a p-n junction 19a is typically established in the region between the active layer 18a and the first cladding layer 16a. A window layer 24a is then located on the second cladding layer 20a, and an upper blocking region 30 is located on the lower surface of a window layer 24a, on top of the double heterostructure 22a. An upper electrode 26a, having a contact layer 28a, is then connected to the upper surface of the window layer 24a. As seen in FIG. 1, when an applied power source 13a is connected between the lower electrode 12a and the upper electrode 26a, current 15a is directed toward the p-n junction 19a, and light 17a is produced in the active layer 18a.

FIG. 2 shows a cross-sectional view of an alternate light emitting diode 32, having a substrate 14b formed on a bottom electrode 12b, and a double heterostructure 22b located on the substrate 14b, wherein the double heterostructure 22b comprises a first cladding layer 16b, an active layer 18b, and a second cladding layer 20b, and wherein a p-n junction 19b is established in the region between the active layer 18b and the first cladding layer 16b. A contact layer 28b is then located on the second cladding layer 20b, and an oxide layer 36a is formed on the upper surface of the contact layer 28b. An extended electrode 26b is located on the top of the LED structure 32, and extends through the oxide layer 36a and the contact layer 28b, to form a Schottky barrier 38a within the second cladding layer 20b. The alternate light emitting diode 32 provides current spreading 15b across the oxide layer 36a and associated contact layer 28b. As well, the oxide layer 36a and associated contact layer 28b may inherently absorb a portion of the light 17b produced within the light emitting diode 32. As well, while the extended conductive electrode 26b may provide current blocking, the conductive electrode structure 26b is inherently light absorbing, in that it blocks the transmission of light 17b which is produced underneath.

B. Lee, M. Jou, and J. Tarn, *Light Emitting Diode Having Transparent Conductivity Oxide Formed on the Contact Layer,* U.S. Pat. No. 5,789,768 (Aug. 4, 1998) disclose "a substrate formed on a first electrode, a first cladding layer of a first conductivity type formed on the substrate, an active layer formed on the first cladding layer, a second cladding layer of a second conductivity type formed on the active layer, a window layer of the second conductivity type formed on the second cladding layer, wherein the electrical resistivity of the window layer is less than the electrical resistivity of the second cladding layer, a contact layer of the second conductivity type formed on the window layer for providing ohmic contact, a conductive transparent oxide layer formed on the contact layer, and a current blocking region formed in the LED. The current blocking region is approximately aligned with a second electrode, and can be the contact layer having a hollow portion therein, an insulating region formed on the contact layer, an ion implanted region in the contact layer and the window layer, or a diffused region in the contact layer and the window layer." While Lee et al. disclose an LED structure which includes current blocking and current spreading structures, the disclosed current blocking structure provides a shallow blocking depth, such that an applied current may readily flow laterally inward, toward the region under the blocking structure, as the current moves downfield though the window layer and the second cladding layer.

FIG. 3 shows a cross-sectional view of a light emitting diode 40 similar to the structure disclosed by Lee et al., having a substrate 14c formed on a bottom electrode 12c, and a double heterostructure 22c located on the substrate 14c, wherein the double heterostructure 22c comprises a first cladding layer 16c, an active layer 18c, and a second cladding layer 20c, and wherein a p-n junction 19c is established in the region between the active layer 18c and the first cladding layer 16c. A contact layer 28c is then located on the second cladding layer 20c, and an oxide layer 36b is formed on the upper surface of the contact layer 28c. An electrode 26c is located on the top of the oxide layer 36b. A hole is created within central region of the contact layer 28c, such that the oxide layer 36b extends through the contact layer 28c, and contacts the upper surface of the second cladding layer 20c, thereby forming a Schottky barrier 38b under the electrode 26c.

While the Schottky barrier 38b may block a portion of the applied current flow 15c in the region under the under the electrode 26c, the blocking mechanism stops at the lower end of the contact layer 28c. Furthermore, while the oxide layer 36b and the contact layer 28c are typically very thin (e.g. such as a few hundred angstroms thick), the window layer 42 is typically much thicker (e.g. typically a few microns or thicker). Therefore, the Schottky barrier 38b typically provides a shallow blocking depth for the light emitting diode 40, and applied current 15c may readily flow laterally inward toward the region under the electrode 26c, as the current 15c moves downfield through the window layer 42 and the second confining layer 20. The current blocking efficiency of the Schottky barrier 38b is thus reduced, such that a significant portion of the light 17c which is produced by the structure 40 is produced by the central portion of the p-n junction 19c, and is either shadowed by the electrode 26c, or consequently produces a bright ring of emitted light 17c around the edge of the electrode 26c.

As well, while the light emitting diode 40 shown in FIG. 3 includes an oxide layer 36a and an associated contact layer 28c to provide current spreading across the structure 40, the oxide layer 36a and associated contact layer 28c may inherently absorb a portion of the light 17c produced within the light emitting diode 32.

It would be advantageous to provide a light emitting diode structure which provides enhanced current blocking. It would also be advantageous to provide a light emitting diode structure which provides current spreading structure, while providing enhanced light transmission characteristics.

While the disclosed prior art light emitting diode structures provide current blocking structures in the region under the top electrode, they fail to provide a light emitting diode structure having a window layer, which provides current blocking beyond the top surface of the window layer. The development of such a light emitting diode structure would constitute a major technological advance.

As well, while some of the conventional prior art light emitting diode structures provide basic current spreading structures, they fail to provide a light emitting diode structure that includes a current spreading structure, while providing enhanced light transmission. The development of such a light emitting diode structure would constitute a major technological advance.

SUMMARY OF THE INVENTION

Structures for light emitting diodes are disclosed, which include improved current blocking and light extraction structures. The diodes typically include a substrate formed on a first electrode, a first confining layer of a first conductivity type formed on the substrate, an active region formed on the first confining layer, a second confining layer of a second conductivity type formed on the active region, and a window layer of the second conductivity type formed on the second confining layer. A contact layer of the second conductivity type is formed on the window layer, a conductive oxide layer is formed on the contact layer, and a second electrode is formed on the conductive oxide layer.

The conductive oxide layer typically includes a central portion located below the second electrode, which-extends into the LED structure, preferably beyond the contact layer and into the window layer, or even beyond the window layer, such as into the second confining layer, or even beyond the second confining layer, into the active layer. The dimension of the second electrode is preferably smaller than that of the central extending portion of the conductive oxide layer. In alternate embodiments of the improved light emitting diode, the central extending portion may be a separate conductive region from the conductive oxide layer.

A resistive or reverse-biased pattern or region is preferably provided below the active layer, to provide enhanced current blocking, wherein the pattern is located in the substrate, or in the first confining layer, and is approximately aligned below the second electrode. The dimension of the resistive or reverse-biased pattern is preferably similar to or larger than the current blocking dimension, which is preferably larger than the second electrode.

The improved light emitting diodes preferably include one or more holes, which are defined in the conductive oxide layer, or within both the conductive oxide layer and the contact layer, to promote the transmission of light from the upper surface of the light emitting diode.

A Distributed Bragg Reflector is also preferably provided between the substrate and the first confining layer, to reduce light absorption within the substrate, and to promote efficient light extraction from the top of the LED structure.

BRIEF DESCRIPTION OF THE DRAWINGS

FIG. 18 is a partial cross-sectional view of an improved light emitting diode, in which a plurality of holes defined through a top conductive oxide layer, and in which a portion of the conductive oxide layer extends through and beyond the contact layer;

FIG. 19 is a partial cross-sectional view of an improved light emitting diode, in which a plurality of holes defined through a top conductive oxide layer, and in which a portion of the conductive oxide layer that is larger than a top electrode extends through and beyond the contact layer;

FIG. 20 is a partial cross-sectional view of an improved light emitting diode, in which a plurality of holes defined through a top conductive oxide layer, and in which a portion of the conductive oxide layer extends through the contact layer to contact the upper surface of a window layer;

DETAILED DESCRIPTION OF PREFERRED EMBODIMENTS

Figure 1:
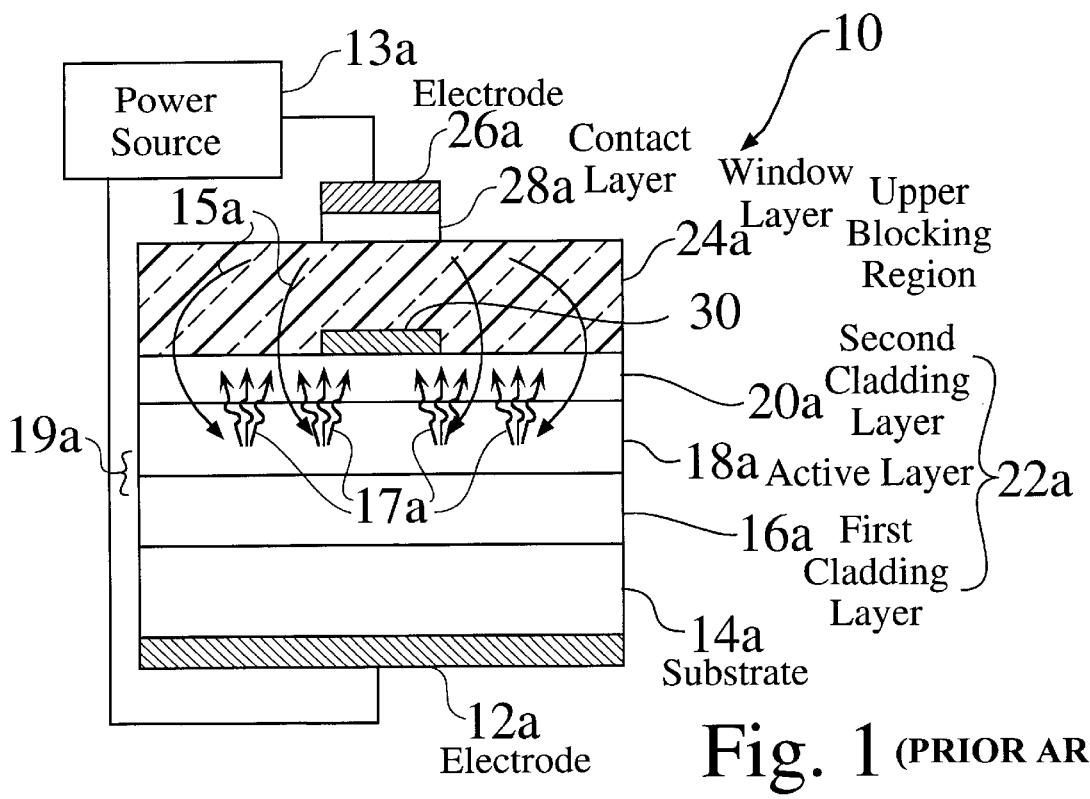
FIG. 1 shows a cross-sectional view of a light emitting diode having an upper blocking layer on the lower surface of a window layer.
Figure 2:
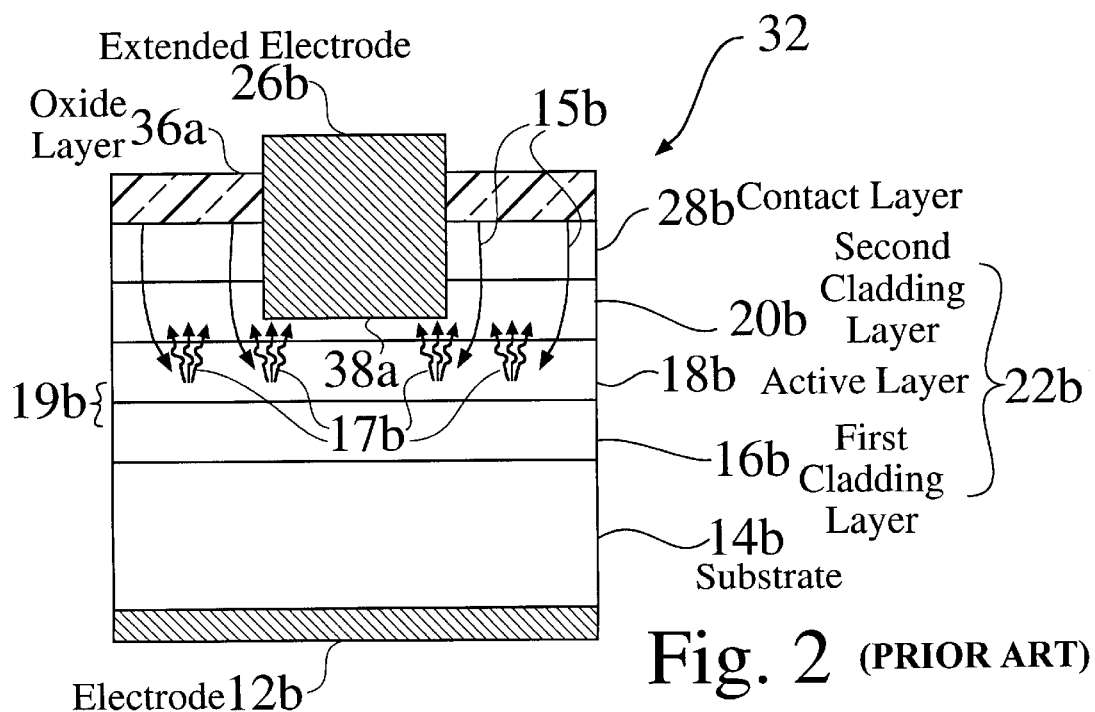
FIG. 2 shows a cross-sectional view of a light emitting diode having an electrode which extends through a contact layer and into a second cladding layer.
Figure 3:
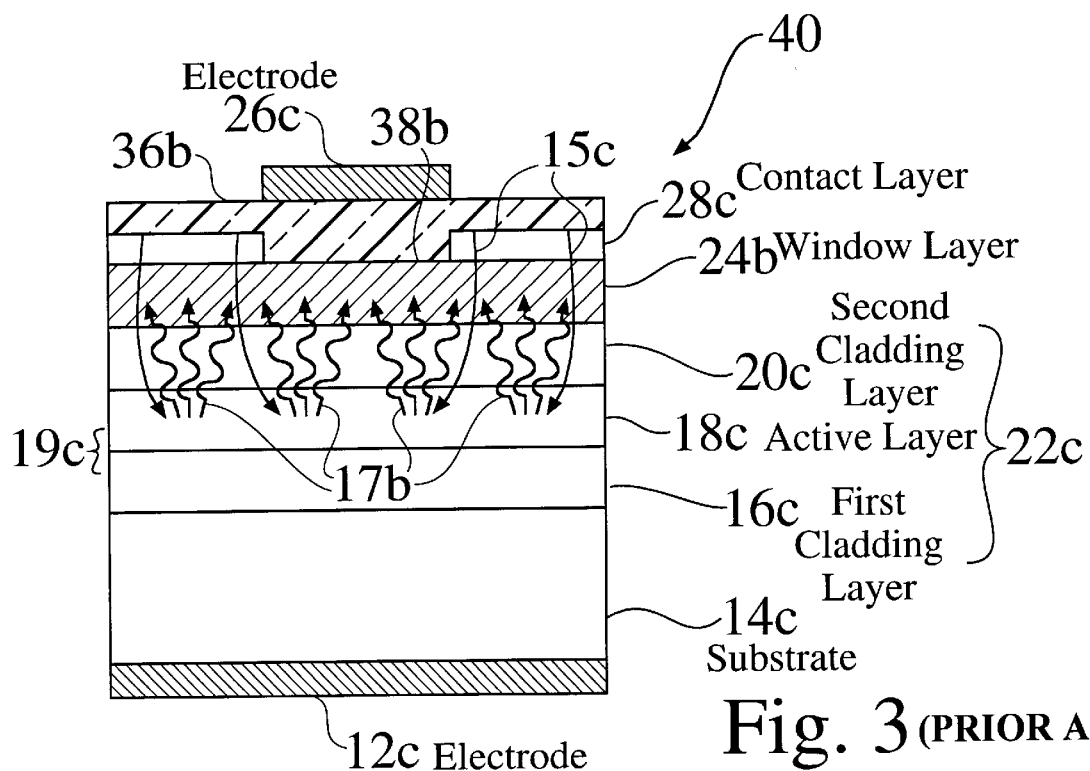
FIG. 3 shows a cross-sectional view of a light emitting diode having an oxide layer which extends through a contact layer to the upper surface of a window layer.
Figure 4:
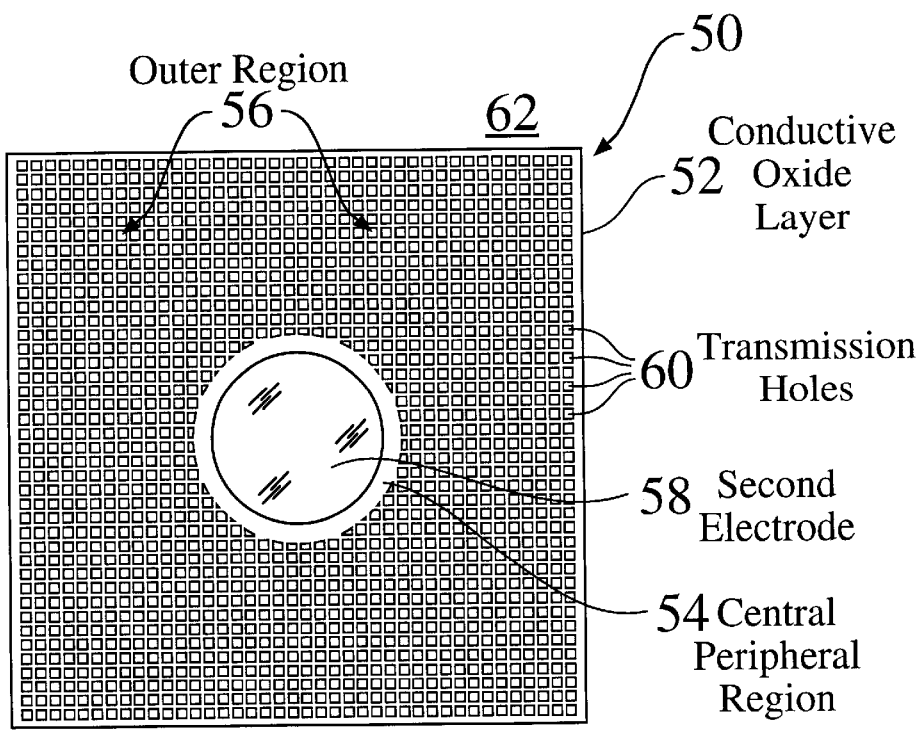
FIG. 4 is a top view of an improved light emitting diode, having a plurality of holes defined through a top conductive oxide layer.
Figure 5:
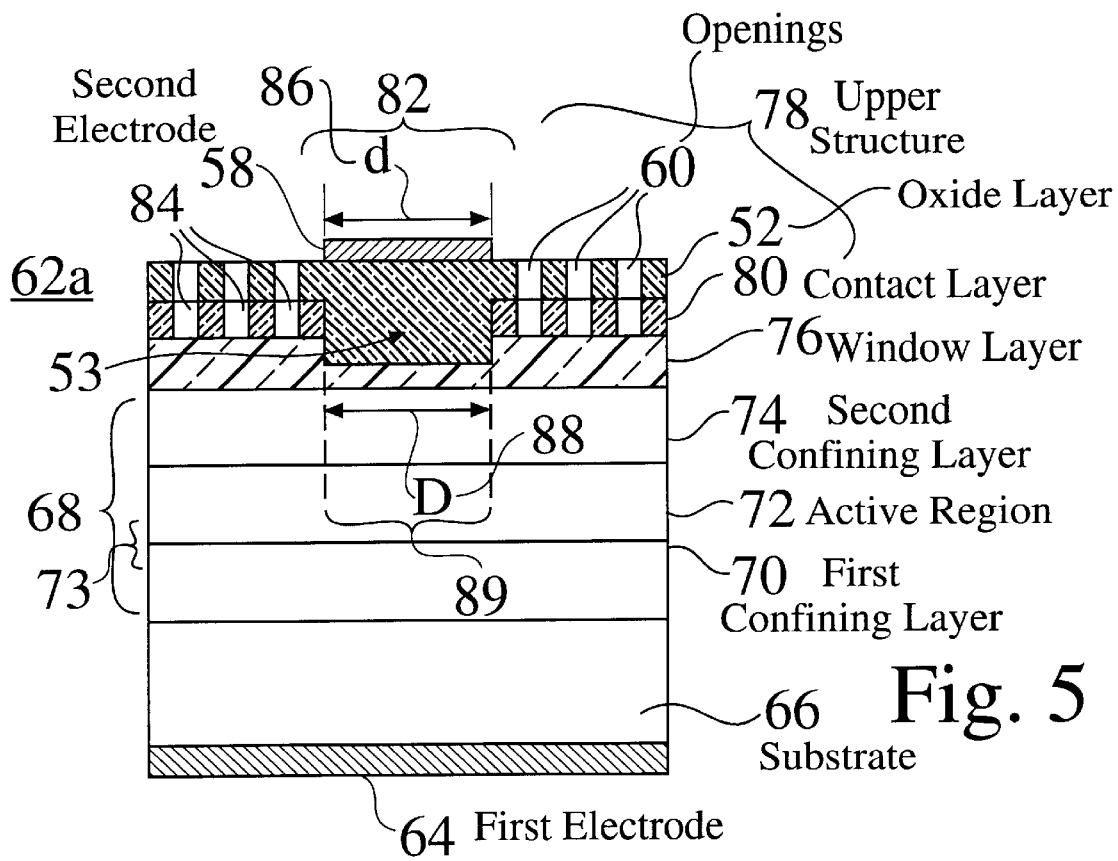
FIG. 5 shows a cross-sectional view of a light emitting diode having a plurality of holes defined through a top conductive oxide layer and through a contact layer, wherein a portion of the conductive oxide layer extends through the contact layer and into a window layer.

FIG. 4 shows a top view 50 of a light emitting diode 62 having a plurality of holes 60 defined through a top conductive oxide layer 52. The light emitting diode structure 60 includes a conductive oxide layer 52, by which a current applied to the second electrode 58 is spread over the periphery 56 of the conductive oxide layer 52. The conductive oxide layer 52 is typically formed over a contact layer 80 (FIG. 5), by which ohmic contact may be made with a window layer 76 (FIG. 5). The electrical resistivity of the conductive oxide layer 52 is less than the electrical resistivity of the window layer 76 and the contact layer 80, such that current applied to the second electrode 58 is effectively spread over the periphery 56 of the conductive oxide layer 52.

While the conductive oxide layer 52 and the contact layer 80 provide ohmic contact to a light emitting diode structure 62 (e.g. such as the LED 62a shown in FIG. 5), generated light is typically required to pass through the conductive oxide layer 52 and the contact layer 80. While the conductive oxide layer 52 and thin contact layer 80 are often considered to be transparent to the generated light, a portion of the generated light which enters the thin conductive oxide layer 52 and the contact layer 80 is typically absorbed (primarily within the contact layer 80). The total absorption within both the conductive oxide layer 52 and the contact layer 80 may account for as much as ten to twenty percent absorption.

As shown in FIG. 4, one or more transmission holes 60 are preferably established in the conductive oxide layer 52, to reduce the absorption (i.e. to promote the extraction) of transmitted light. As seen in FIG. 5, the holes 60 defined in the conductive oxide layer 52 may preferably extend into defined openings 84 in the contact layer 80, to further reduce the absorption of light. The density, shape, and the size of the defined openings 60,84 may preferably be optimized to maximize electrical conductivity and to minimize light absorption. The defined openings or holes 60 in FIG. 4 are shown as a pattern of square holes 60, for illustrative purposes only. Any variety of density, shape, and size of the defined openings 60,84 may preferably be established, such as to reduce light absorption across the entire surface 56, or to selectively promote the transmission of light through various holes 60.

FIG. 5 shows a cross-sectional view of a light emitting diode 62a having a plurality of holes 60,84 defined through a top conductive oxide layer 52 and through a contact layer 80 respectively within the upper structure 78 of the light emitting diode 62a, wherein a portion 53 of the conductive oxide layer 80 extends through the contact layer 80 and into a window layer 76.

As shown in FIG. 5, a substrate 66 is formed on a first electrode 64. A first confining layer 70 of a first conductivity type is formed on the substrate 66. An active region 72, which is typically undoped, is then formed on the first confining layer 70. The active region 72 may be a single active layer, a single quantum well structure, a multiple quantum well structure, or a multiple well structure.

A second confining layer 74 of the second conductivity type (e.g. such as p-type) is formed on the active region 72, creating a p-n junction 73 in the region relatively near the lower surface 118a (FIG. 26) of the active region 72 and the upper surface 116b of the first confining layer 70. A window layer 76 of the second conductivity type (e.g. p-type) is formed on the second confining layer 74, which promotes current spreading, as an applied current moves toward the p-n junction 73 established between the active region 72 and the second confining layer 74.

A contact layer 80 of the second conductivity type (e.g. p-type) is formed on the window layer 76, and a conductive oxide layer 52 is formed on the contact layer 80. The conductive oxide layer 52 is preferably at least partially transparent. A second electrode 58 is established within the central region 82 of the conductive oxide layer 52. A pattern of one or more openings 60, 84 are preferably established on the conductive transparent layer 52 and the contact layer 80 respectively, such as to reduce any absorption of light within the conductive oxide layer 52 and the contact layer 80.

Figure 26:
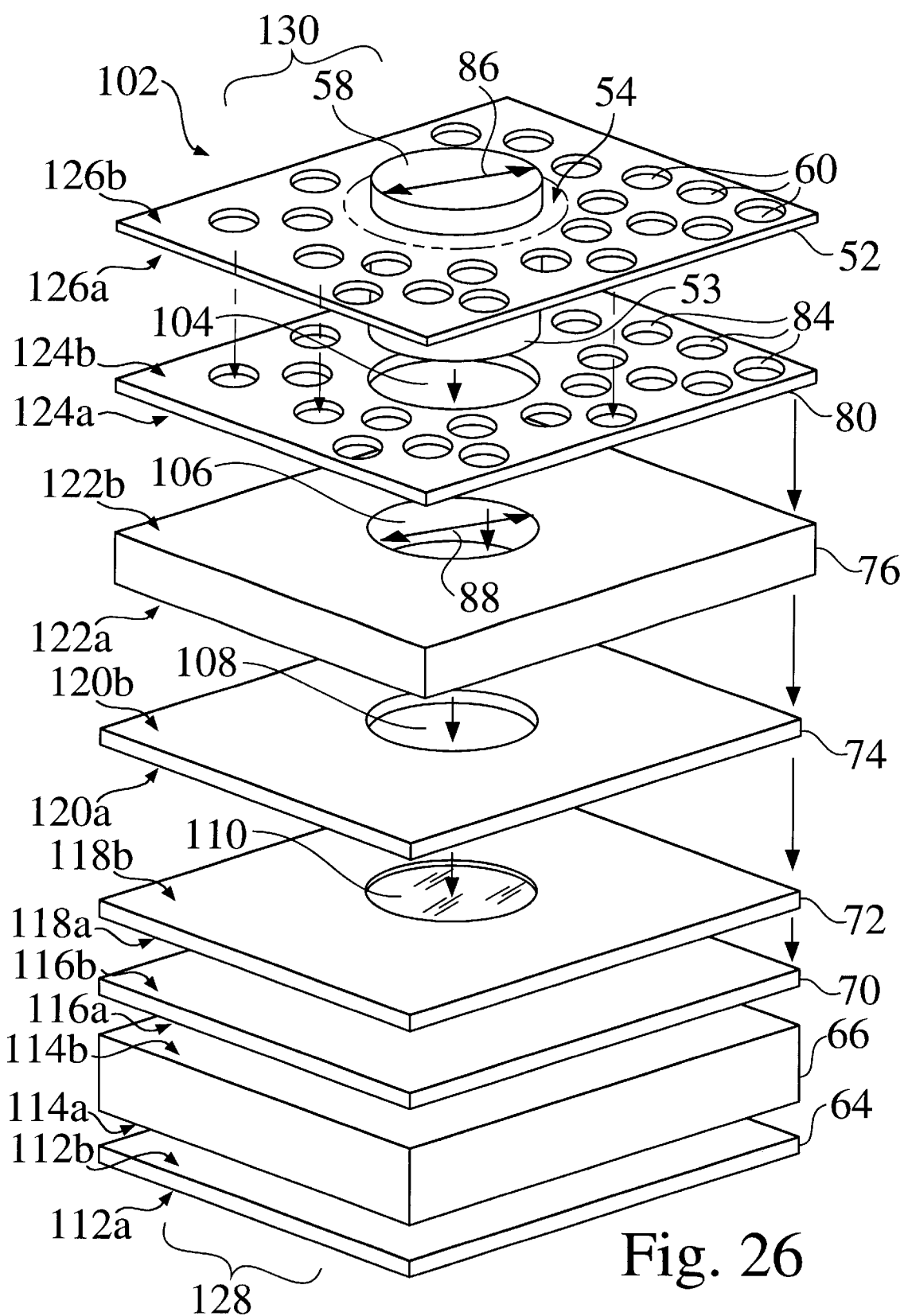
FIG. 26 is an expanded assembly view of an improved light emitting diode.

As seen in FIG. 5, the contact layer 80 includes a hollow portion 104 extending therethrough (FIG. 26), and the window layer 76 includes a hollow portion 106 extending into the window layer 76 from the upper surface 122b (FIG. 26). A portion 53 of the conductive oxide layer 80 extends through the contact layer 80, and into hollow portion 106 defined in the window layer 76.

The extended portion 53 of the conductive oxide layer 52 provides an improved current blocking structure for the LED structure 62a, such that applied current is blocked beyond the contact layer 80, within the window layer 76. The extended portion 53 reduces the spreading of applied current into the region 89 beneath the second electrode 58, beyond the blocking structure 53. Therefore, less applied current flows into the region 89 below the second electrode 58, when passing through the window layer 76 and the second confining layer 74 before reaching the p-n junction 73 and the active region 72. As described above, a substantial portion of the current which passes through the active region 72 in the central region 89 below the second electrode 58 is wasted, since a substantial portion of the light which is generated within the central region 89 of the active region 72 is blocked by the second electrode 58, as the light is transmitted from the diode 62a.

Figure 6:
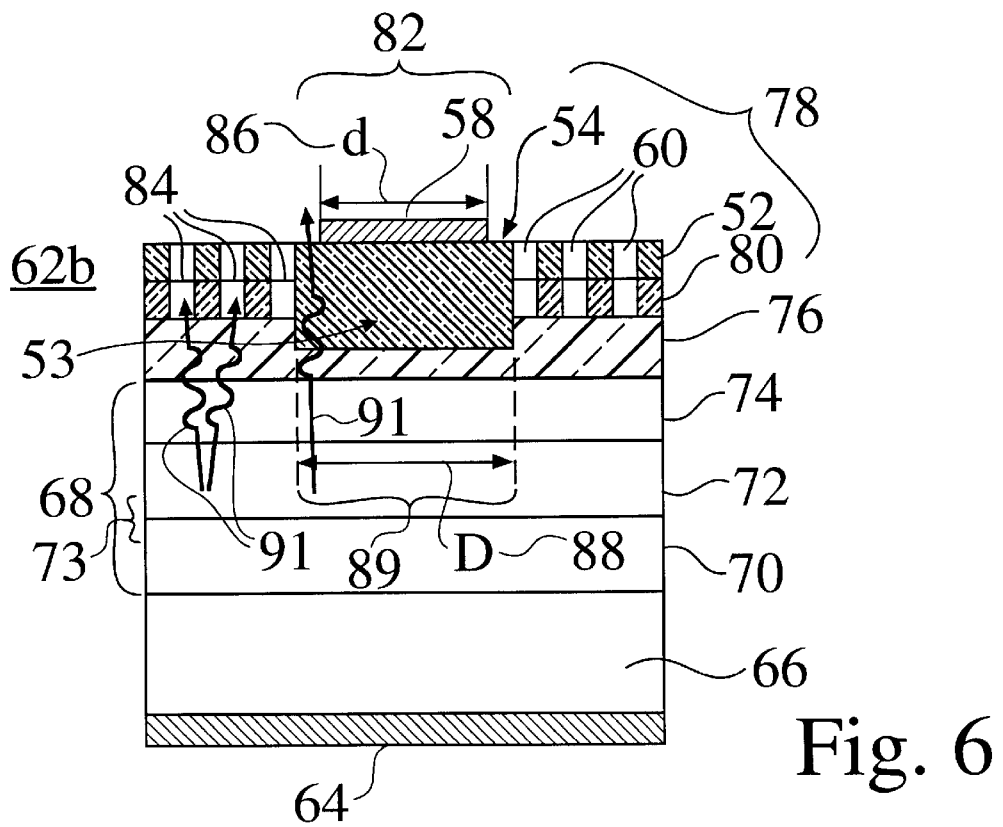
FIG. 6 shows a cross-sectional view of a light emitting diode having a plurality of holes defined through a top conductive oxide layer and through a contact layer, wherein a portion of the conductive oxide layer that is larger than a top electrode extends through the contact layer and into a window layer.

As seen in FIG. 5, the size 86 of the electrode, designated as "d", may be approximately equal to the size 88 of the extended portion 53 of the conductive oxide layer 52, designated as "D". FIG. 6 shows a cross-sectional view of a light emitting diode 62b having a similar structure to the light emitting diode 62a of FIG. 5. However, in FIG. 6, the size 88 of the extended portion 53 of the conductive oxide layer 52, which is similarly used for current blocking, is preferably larger than the size 86 of the second electrode 58.

The conductive oxide layer 52 is relatively transparent to generated light 91, such that light 91 which is generated near the central region 89 may pass through the extended portion 53, and be transmitted from the central peripheral region 54 of the upper surface 126b (FIG. 26) of the conductive oxide layer 52, since this region 54 is not shadowed by the second electrode 58.

The geometry of the second electrode 58 and the extended portion 53 of the oxide layer 52 typically have a circular cross section, wherein the size 86 of the second electrode 58, designated as "d", and the size 88 of the extended portion 53 of the conductive oxide layer 52, designated as "D", are diameters, respectively (FIG. 26). However, various geometries may alternately be used. The second electrode 58 is preferably approximately aligned with the extended portion 53 of the conductive oxide layer 52, such that the LED structure 62 preferably provides radial symmetry for current blocking and light extraction. In alternate embodiments of the improved LED structures 62, the extended current blocking portion 53 is a conductive oxide region 53 which is formed separately from the conductive oxide layer 52.

As seen in FIG. 5 and FIG. 6, a plurality of holes 60,84 are preferably defined through both the top conductive oxide layer 52 and the contact layer 80 respectively, to reduce the absorption (i.e. to promote the extraction) of transmitted light 91. The density, shape, and the size of the defined openings 60,84 may preferably be optimized, typically to maximize electrical conductivity and to minimize light absorption.

Figure 7:
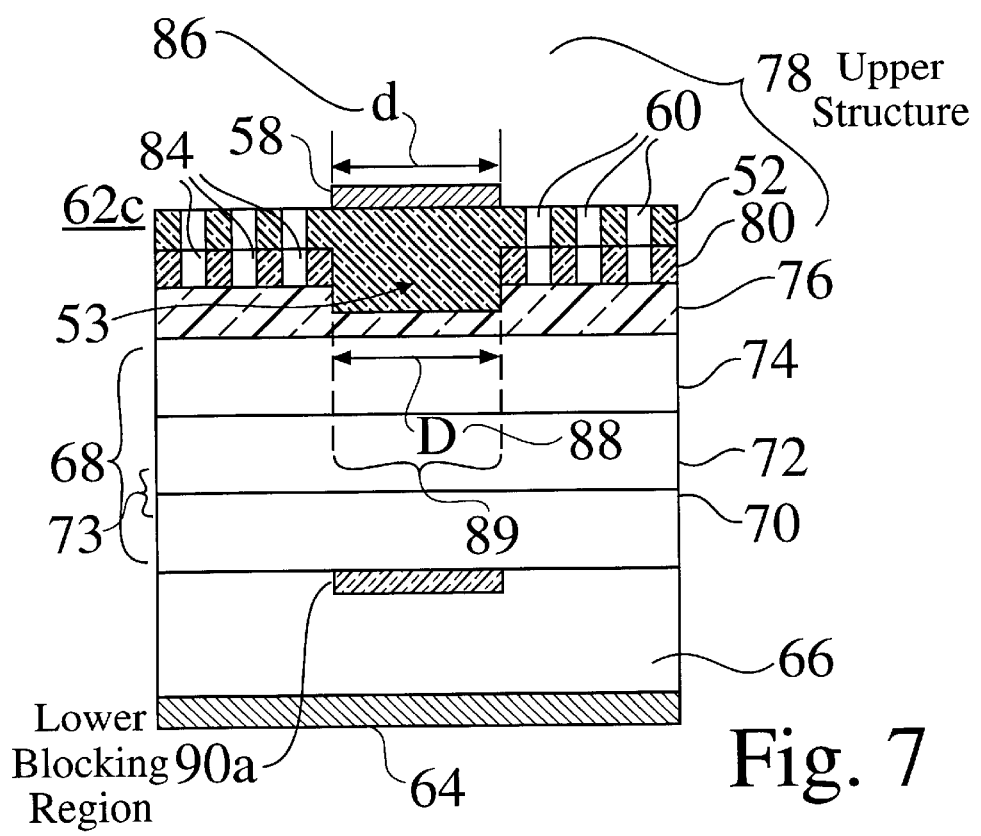
FIG. 7 shows a cross-sectional view of a light emitting diode having a plurality of holes defined through a top conductive oxide layer and through a contact layer, wherein a portion of the conductive oxide layer extends through the contact layer and into a window layer, and wherein a non-ohmic region is located below the first confining layer.

FIG. 7 shows a cross-sectional view of a light emitting diode 62c having a similar structure to the light emitting diode 62a of FIG. 5. A substrate 66 is formed on a first electrode 64. A first confining layer 70 of the first conductivity type is formed on the substrate 66. An active region 72 is formed on the first confining layer 70, and a second confining layer 74 of the second conductivity type is formed on the active region 72. A window layer 76 of the second conductivity type is formed on the second confining layer 74, a contact layer 80 of the second conductivity type is formed on the window layer 76, and a conductive transparent oxide layer 52 is formed on the contact layer 80.

Figure 13:
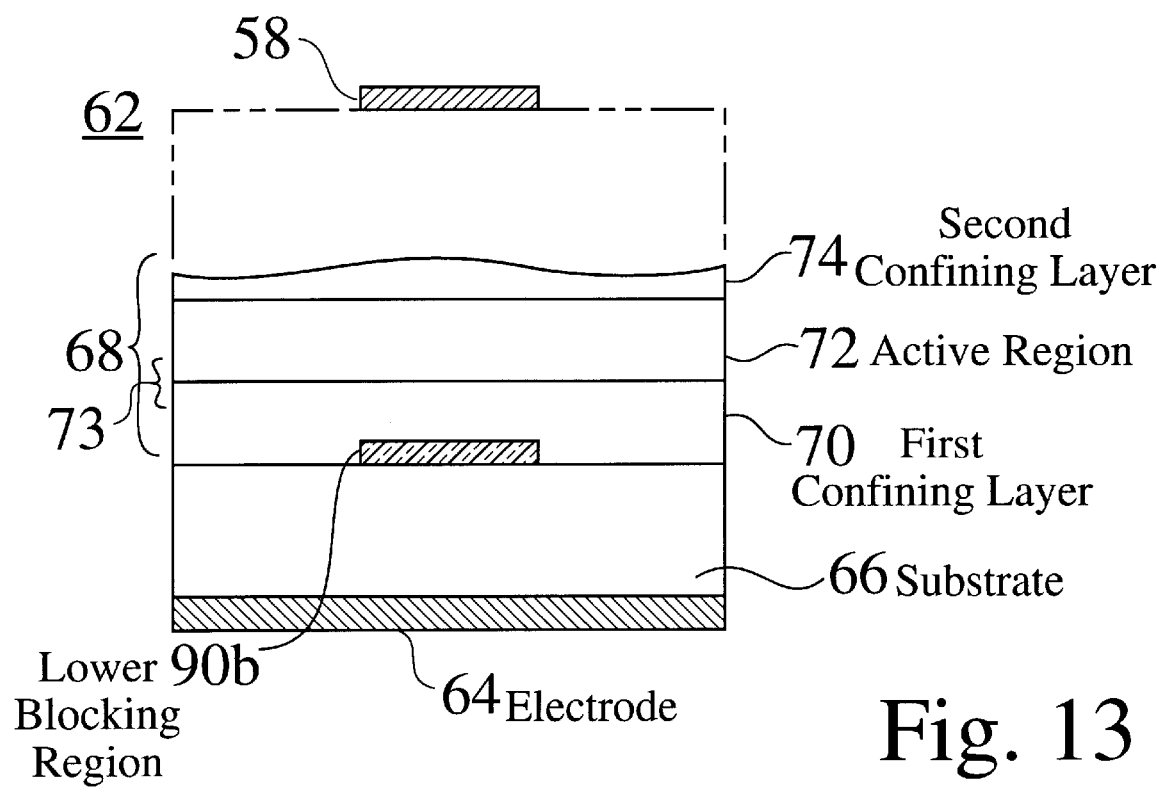
FIG. 13 shows an alternate embodiment of the non-ohmic lower blocking region which is preferably used in various embodiments of the improved light emitting diode, in which the non-ohmic region is located above the substrate, within a first confining layer of a double heterostructure.
Figure 14:
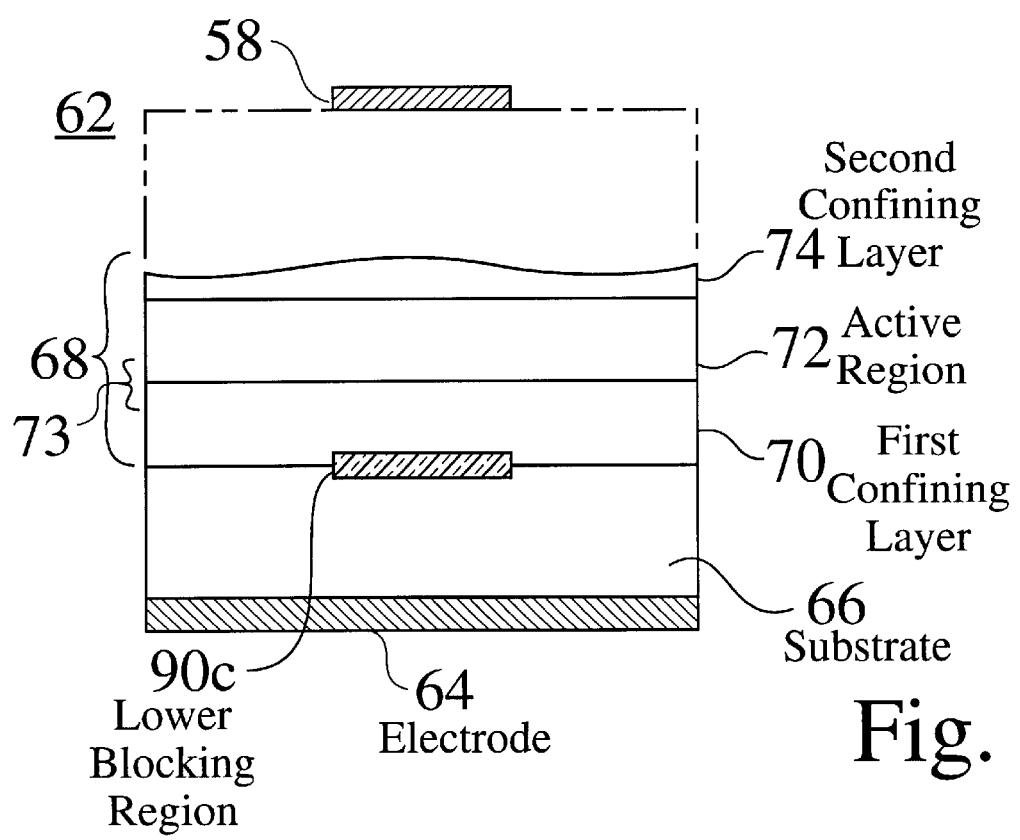
FIG. 14 shows an alternate embodiment of the non-ohmic lower blocking region which is preferably used in various embodiments of the improved light emitting diode, in which the non-ohmic region extends into both the substrate and the first confining layer of a double heterostructure.

However, in FIG. 7, a non-ohmic lower blocking region 90a is preferably located at the bottom of the double heterostructure 68. The substrate 66 is patterned with a non-ohmic region 90a, which is approximately aligned below the second electrode 58. The preferred non-ohmic region 90a reduces lateral spreading of applied current toward the central region 89 under the second electrode 58, after the applied current passes the extended current blocking portion 53 of the oxide layer 52. The material for the non-ohmic region 90a can be an oxide or other material which is significantly more resistive than the substrate 66. The non-ohmic region 90a is typically a resistive or reverse biased pattern, which is formed either within or on the substrate 66. In some preferred embodiments of the light emitting diode structures 62, ions (e.g. such as H+ or O+) are implanted to form the non-ohmic region 90a, 90b (FIG. 13), 90c (FIG. 14). The dimension of the non-ohmic region 90a is typically the same size 88 as the current blocking extended portion 53 of the conductive oxide layer 52, which is preferably slightly larger than the second electrode 58.

Figure 8:
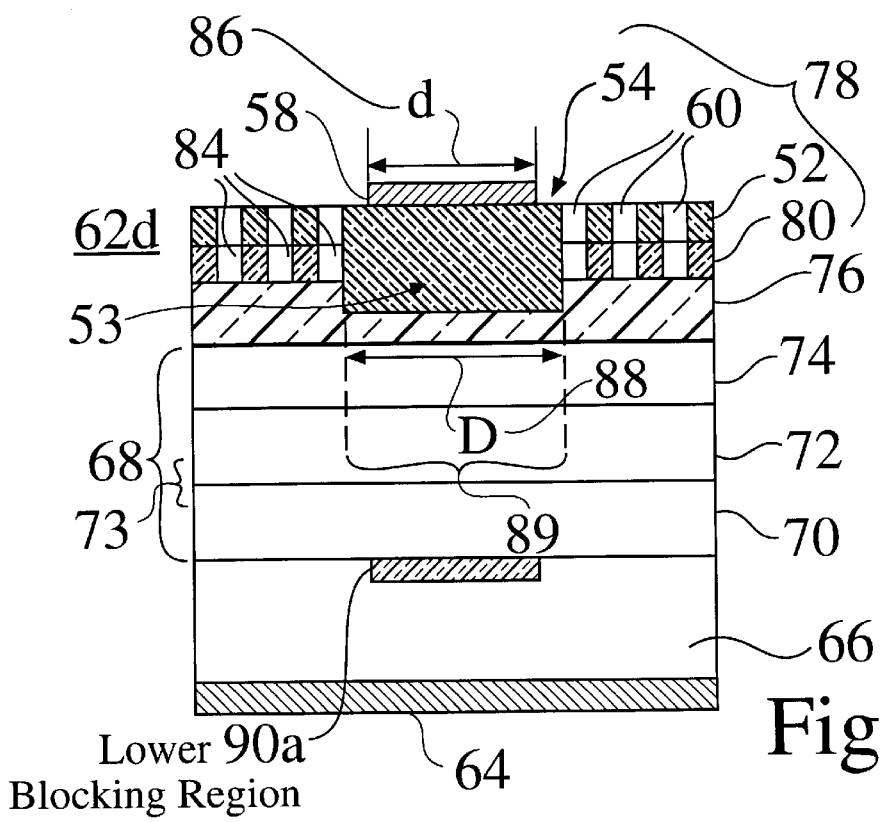
FIG. 8 shows a cross-sectional view of a light emitting diode having a plurality of holes defined through a top conductive oxide layer and through a contact layer, wherein a portion of the conductive oxide layer that is larger than a top electrode extends through the contact layer and into a window layer, and wherein a non-ohmic region is located below the double heterostructure.

FIG. 8 shows a cross-sectional view of a light emitting diode 62d having a similar structure to the light emitting diode 62b of FIG. 6, and having a non-ohmic lower blocking region 90a which is located at the bottom of the double heterostructure 68, as described in reference to FIG. 7. The light emitting diode 62d of FIG. 8 provides enhanced current blocking into the window layer 76, wherein the size 88 of the extended portion 53 of the conductive oxide layer 52 is larger than the size 86 of the second electrode 58. The size of the lower current blocking structure 90a may preferably be similar to the size 86 of the second electrode 58, similar to the size 88 of the extended portion 53, or may preferably be even larger than the size 88 of the extended portion 53.

Figure 9:
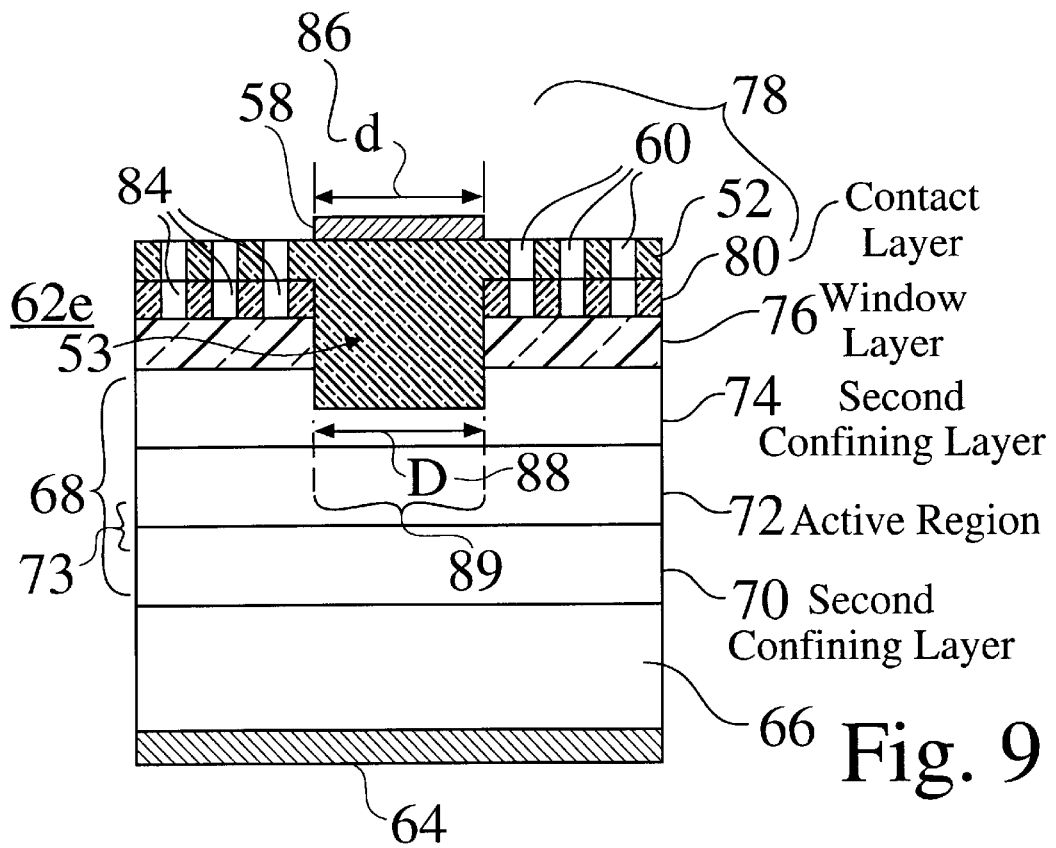
FIG. 9 shows a cross-sectional view of a light emitting diode similar to the light emitting diode of FIG. 5, in which a portion of the conductive oxide layer extends through both the contact layer and the window layer, and into a second confining layer.

In alternate embodiments of the improved light emitting diodes 62, the current blocking structure 53 may extend through or even beyond the lower surface 122a (FIG. 26) of the window layer 76, typically to provide enhanced current blocking. FIG. 9 shows a cross-sectional view of a light emitting diode 62e which is similar to the light emitting diode 62a of FIG. 5, in which a portion 53 of the conductive oxide layer 52 extends through and beyond both the contact layer 80 and the window layer 76, and into the second confining layer 74. The further extended portion 53 reduces the spreading of applied current into the region 89 beneath the second electrode 58, beyond the blocking structure 53. Therefore, less applied current flows into the region 89 below the second electrode 58, when passing through the second confining layer 74, before reaching the active region 72.

Materials for Improved LED Structures

In the following discussion of materials for the improved light emitting diode structures 62, the first conductivity type is assumed to be an n-conductivity type, while the second conductivity type is assumed to be a p-conductivity type. Similarly, as is known in the art, the first conductivity type may alternately be a p-conductivity type, where the second conductivity type is an n-conductivity type.

In some embodiments of the improved light emitting diodes 62 (e.g. such as LED 62d in FIG. 8), the substrate layer 66 is comprised of an n-type GaAs, and is formed on the first electrode 64, which is preferably an n-type "back metal" electrode 64. The lower blocking region 90a may be any non-ohmic material system, such as oxide, nitride, un-doped, or p-type semiconductor, which is compatible to the n-type GaAs substrate 66, wherein the electrical resistivity of the lower blocking layer 90a is preferably higher than the electrical resistivity of the first confining layer 70.

In some preferred embodiments of the light emitting diode structures 62, the first confining layer 70 comprises an AlInP structure, wherein a smaller amount of Ga may preferably be added. For example, in some preferred embodiments of the light emitting diode structures 62, the first confining layer 70 comprises $(Al_xGa_{1-x})_{1-y}In_yP$, where x may vary from 0.5 to 1, and y is normally near (i.e. approximately) 0.5.

Similarly, some preferred embodiments of the second confining layer 74 comprise an AlInP structure, wherein a smaller amount of Ga may preferably be added. For example, in some preferred embodiments of the light emitting diode structures 62, the second confining layer 74 comprises $(Al_xGa_{1-x})_{1-y}In_yP$, where x may vary from 0.5 to 1, and y is normally near (i.e. approximately) 0.5.

As well, in some preferred embodiments of the light emitting diode structures 62, the active layer 72 comprises an GaInP structure, wherein a small amount of Al may be added, such as to modify the wavelength of emitted light 91 for the light emitting diode structures 62. For example, in some preferred embodiments of the light emitting diode structures 62, the active region 72 comprises $(Al_xGa_{1-x})_{1-y}In_yP$, where x may typically vary from 0 to 0.4, and y is normally near (i.e. approximately) 0.5.

In one embodiment of the improved light emitting diode 62d, the double heterostructure includes a first confining layer 70 comprising an n-type AlInGaP, an active region 72 comprising an AlInGaP, and a second confining layer 74 comprising an p-type AlInGaP. The active region 72 may preferably be a single AlInGaP layer of approximately 1 micron or less, a multiple well layer of a similar total thickness, a single quantum well, or a multiple quantum well. In some embodiments of the improved light emitting diodes 62, the thickness of both confining layers 70,74 is typically on the order of one or more microns.

A p-type window layer 76, which is typically relatively thick, preferably on the order of a few microns (e.g. such as 5–10 microns), is located on the second confining layer 74. The window layer 76 preferably has a high electrical conductivity, and is relatively optically transparent to the emitted light. The window layer 76 is preferably comprised from materials such as GaP, GaAsP, AlGaAs, InGaP, AlInGaP, CdS, ZnS, ZnTe, or ZnSe (or other Column III-Column V or Column II-Column VI material combinations which are somewhat transparent to visible light, as selected from the Periodic Table of Elements).

A p-type contact layer 80 (e.g. such as but not limited to a few hundred angstroms thick) is formed on the window layer 76. The contact layer 80 is preferably comprised of GaAs, GaAsP, AlGaAs, InGaAs and InAs. A conductive oxide layer 52 is then formed on the contact layer 80. The contact layer 80 provides ohmic contact with the transparent conductive oxide layer 52. A p-type metal second electrode 58 is formed on top of the oxide layer 52, to complete the improved diode structure 62d. The size 86 of the p-type second electrode 58 is preferably smaller than the size 88 of the removed portions 104,106 (FIG. 26) of the contact region 80 and window layer region 76 respectively, to improve light extraction for the light emitting diode structure 62d.

In some embodiments of the improved light emitting diode 62, once the window layer 76 and the contact layer 80 are formed, hollow portions 104, 106 are defined and removed from central region 82 of the contact layer 80 and the window layer 76 respectively. The conductive transparent oxide layer 52 is then applied to the structure, to create an extending portion 53 within the hollow portions 104, 106 of the contact layer 80 and the window layer 76, and to form a conductive surface, to facilitate lateral current spreading. The conductive transparent oxide layer 52 is preferably comprised of indium oxide, tin oxide, cadmium oxide, cadmium tin oxide, or indium tin oxide.

Figure 10:
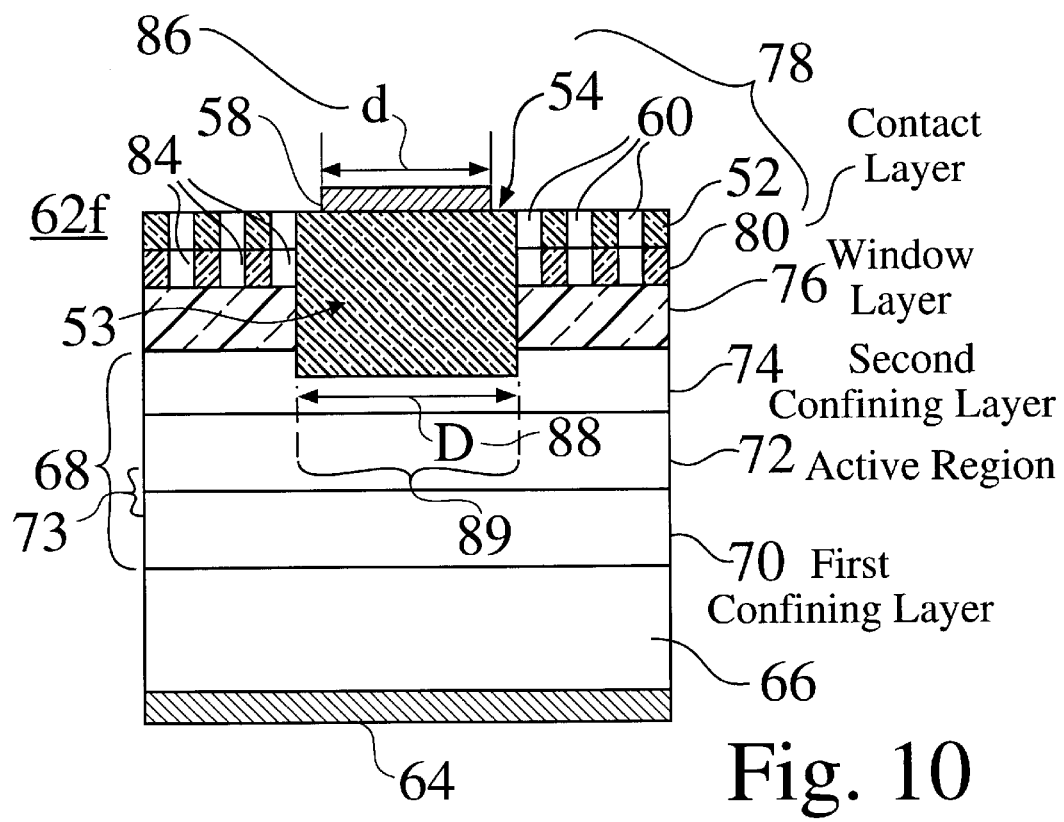
FIG. 10 shows a cross-sectional view of a light emitting diode similar to the light emitting diode of FIG. 6, in which a portion of the conductive oxide layer extends through both the contact layer and the window layer, and into a second confining layer.

As seen in FIG. 9, the size 86 of the second electrode 58, designated as "d", is approximately equal to the size 88 of the extended portion 53 of the conductive oxide layer 52, designated as "D". FIG. 10 shows a cross-sectional view of a light emitting diode 62f having a similar structure to the light emitting diode 62e of FIG. 9. However, in FIG. 10, the size 88 of the extended portion 53 of the conductive oxide layer 52, which is similarly used for current blocking, is preferably larger than the size 86 of the second electrode 58, typically to provide enhanced current blocking. Light 91 (FIG. 6) which is generated in the central region 89 directly below the second electrode 58 (due to back spreading current) is preferably reduced. As described above, in reference to the light emitting diode 62b shown in FIG. 6, the enlarged size 88 of the extended portion 53 of the conductive oxide layer 52 allows a portion of the light 91, which is generated in the central region 89, to escape through the extended central region 56 (FIG. 4) of the oxide layer 52, beyond the edge of the second electrode 58, such that the light may efficiently be transmitted from the LED structure 62f.

Figure 11:
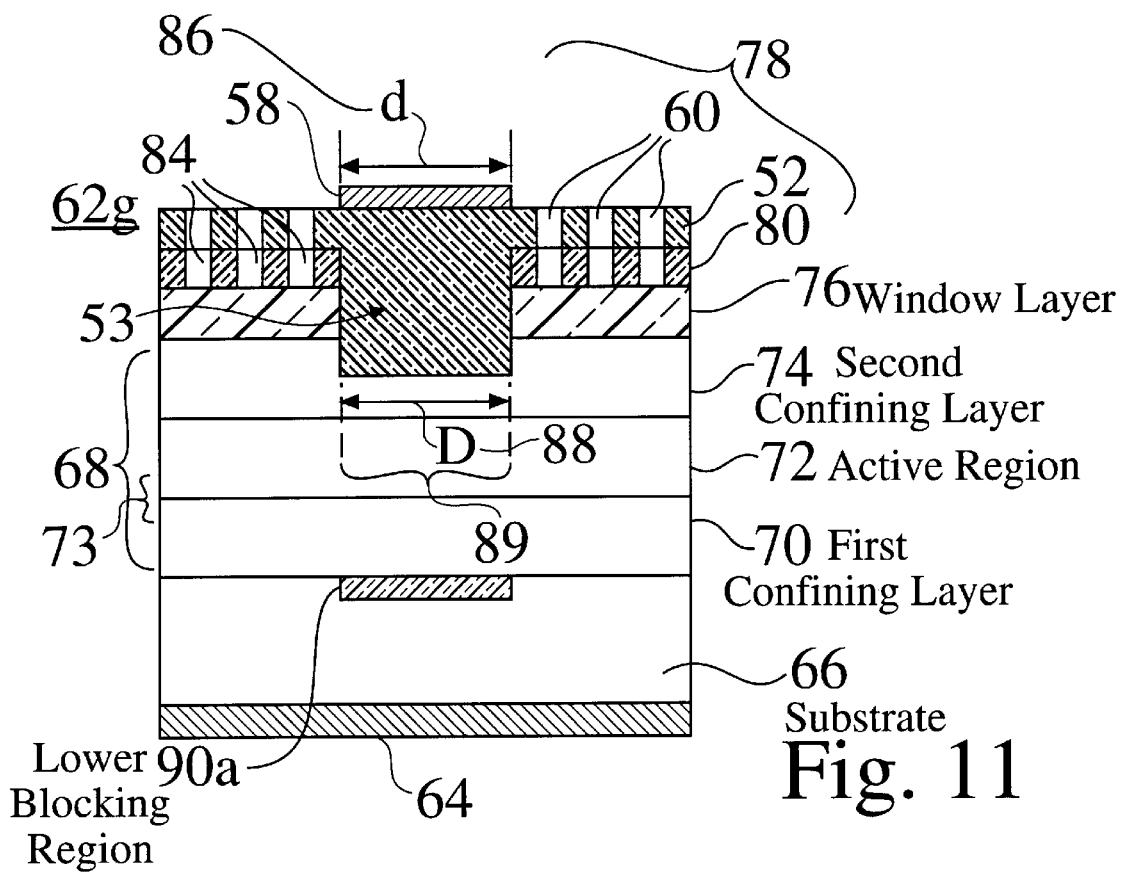
FIG. 11 shows a cross-sectional view of a light emitting diode similar to the light emitting diode of FIG. 7, in which a portion of the conductive oxide layer extends through both the contact layer and the window layer, and into a second confining layer.

FIG. 11 shows a cross-sectional view of a light emitting diode 62g having a similar structure to the light emitting diode 62e of FIG. 9. However, in FIG. 11, a non-ohmic lower blocking region 90a is located at the bottom of the double heterostructure 68. The substrate 66 is patterned with a non-ohmic region 90a, which is approximately aligned below the second electrode 58. The preferred non-ohmic region 90a reduces lateral spreading of applied current toward the central region 89 under the second electrode 58 after the applied current passes the extended current blocking portion 53 of the oxide layer 52. As described above, the material for the non-ohmic region 90a can either be an oxide or other material which is significantly more resistive than the substrate 66, or a material which is a different conductivity type than the substrate 66 (i.e. thereby forming a reverse junction).

Figure 12:
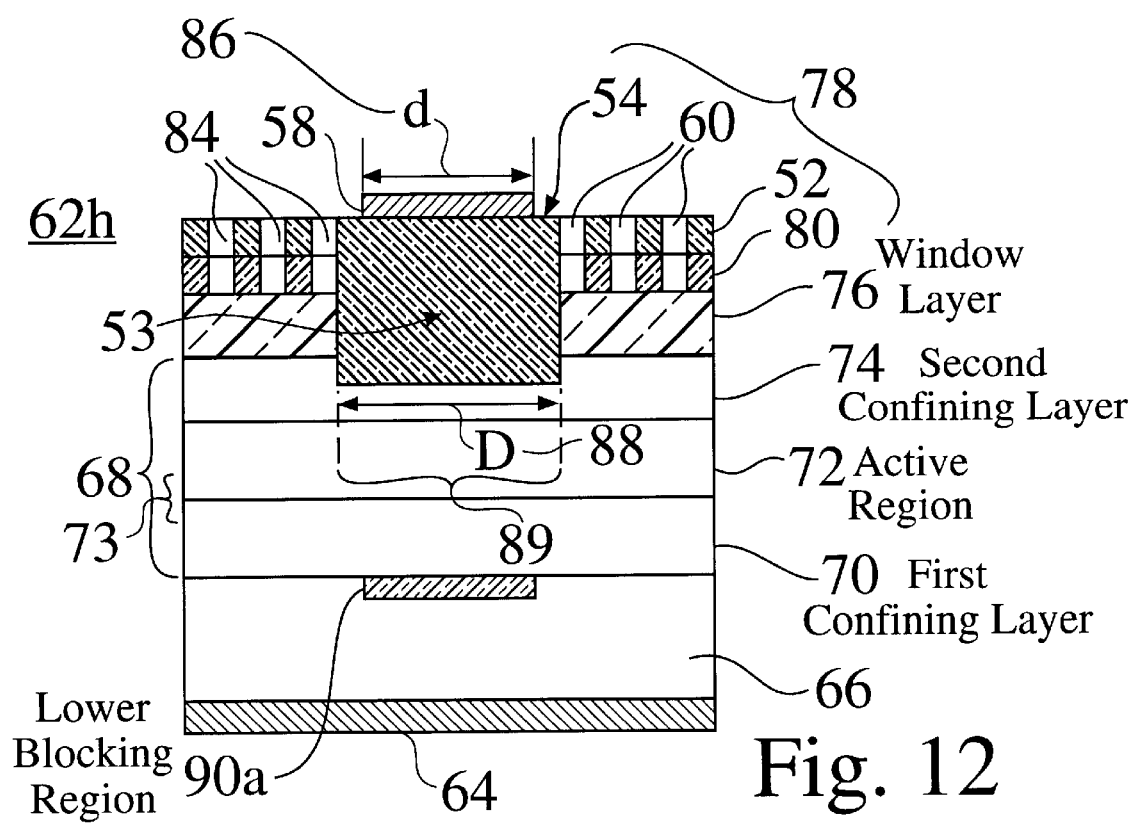
FIG. 12 shows a cross-sectional view of a light emitting diode similar to the light emitting diode of FIG. 8, in which a portion of the conductive oxide layer extends through both the contact layer and the window layer, and into a second confining layer.

FIG. 12 shows a cross-sectional view of a light emitting diode 62h having a similar structure to the light emitting diode 62f of FIG. 10, and having a non-ohmic lower blocking region 90a located at the bottom of the double heterostructure 68, as described in reference to FIG. 11. The light emitting diode 62h of FIG. 12 provides enhanced current blocking into the second confining layer 74 (wherein the size 88 of the extended portion 53 of the conductive oxide layer 52 is larger than the size 86 of the second electrode 58), as well as a lower current blocking structure 90a. The size of the lower current blocking structure 90a may preferably be similar to the size 86 of the second electrode 58, similar to the size 88 of the extended portion 53, or may preferably be even larger than the size 88 of the extended portion 53.

Alternate Lower Blocking Structures

While the lower blocking region 90a shown in FIG. 11 and FIG. 12 is located below the first confining layer 70, the lower blocking region 90 may alternately be established or formed in the LED structure 62 below the active region 72. FIG. 13 shows an alternate embodiment of the non-ohmic lower blocking region 90b, which is preferably used in various embodiments of the improved light emitting diode 62, in which a non-ohmic region 90b is located above a lower substrate 66, within a first confining layer 70 of a double heterostructure 68. FIG. 14 shows a second alternate embodiment of the non-ohmic lower blocking region 90c which is preferably used in various embodiments of the improved light emitting diode 62, in which a non-ohmic region 90c is located between a lower substrate 66 and a first confining layer 70 of a double heterostructure 68. As described above, the material for the non-ohmic regions 90a,90b,90c is typically an oxide or other material which has a higher electrical resistance than the substrate 66, or a material of a different conductivity type than that of the substrate 66.

Distributed Bragg Reflector Structures

Figure 15:
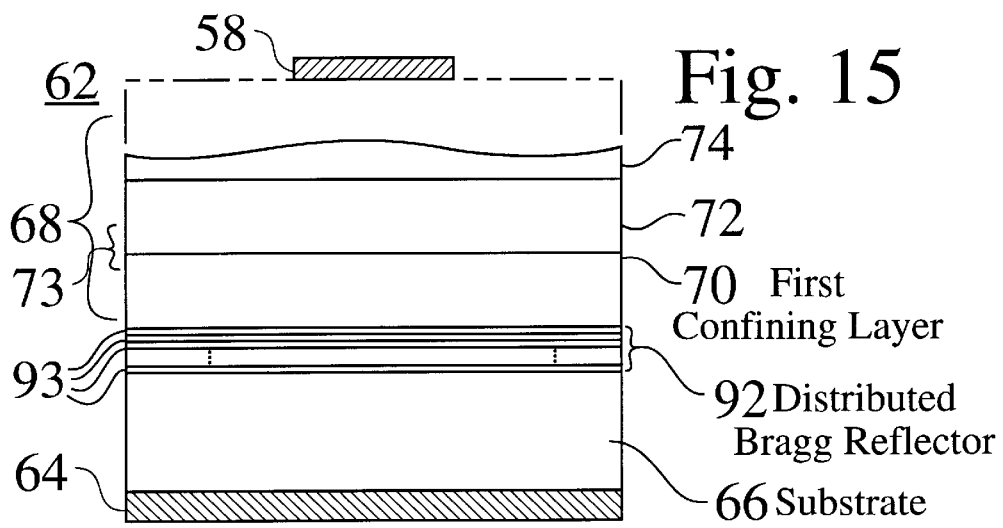
FIG. 15 shows a Distributed Bragg Reflector structure located between the substrate and the first confining layer of an improved light emitting diode.

FIG. 15 shows a Distributed Bragg Reflector structure 92 located between the substrate 66 and the first confining layer 70 of an improved light emitting diode 62. The various embodiments of the improved light emitting diodes 62 may preferably include a Distributed Bragg Reflector (DBR) structure 92, to reduce the absorption of the light by the substrate 66, which is typically opaque, thereby increasing the extraction efficiency of the LED structure 62. The Distributed Bragg Reflector (DBR) structure 92 is typically grown on the substrate 66, before the double heterostrucure 68 is established. The Distributed Bragg Reflector (DBR) structure 92 is typically comprised of a plurality of sublayers 93, which are formed between the substrate 66 and the first confining layer 70, and are preferably comprised of $Al_xGa_{1-x}As$, where x may vary between 0 and 1.

Figure 16:
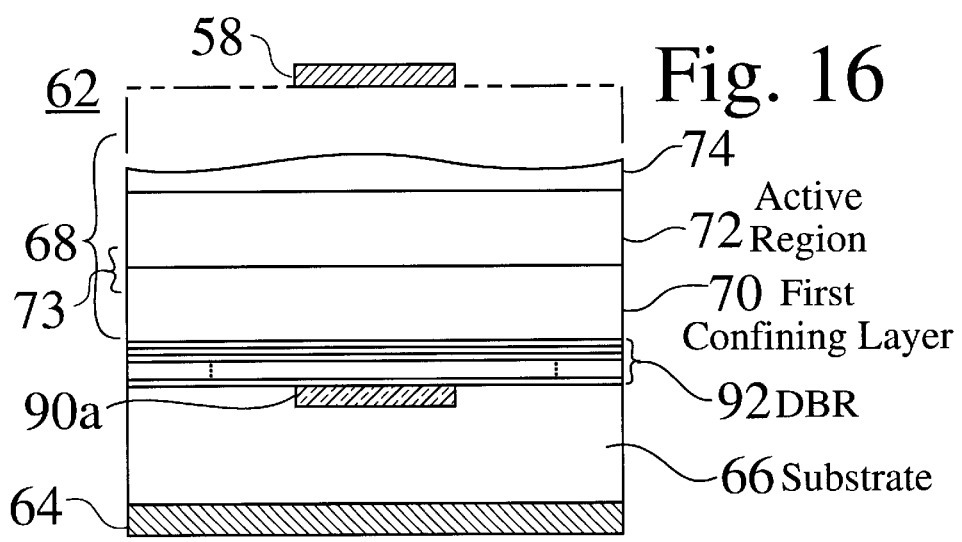
FIG. 16 shows a Distributed Bragg Reflector structure located between the substrate and the first confining layer of an improved light emitting diode, wherein a non-ohmic region is located below the Distributed Bragg Reflector structure, within a lower substrate.
Figure 17:
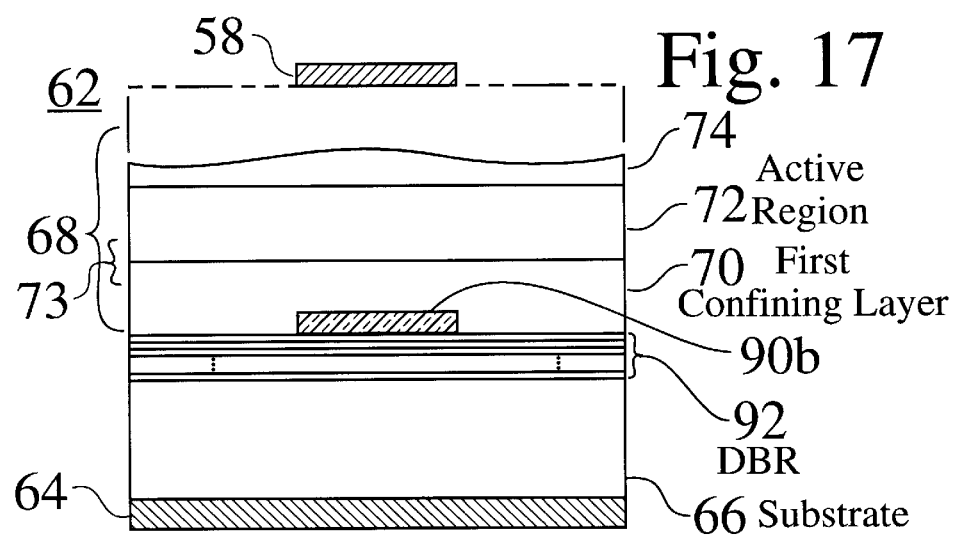
FIG. 17 shows a Distributed Bragg Reflector structure located between the substrate and the first confining layer of an improved light emitting diode, wherein a non-ohmic region is located above the Distributed Bragg Reflector structure, within the first confining layer of a double heterostructure.

In alternate embodiments of the improved light emitting diode 62, the Distributed Bragg Reflector structure 92 may be implemented in conjunction with a non-ohmic region 90. FIG. 16 shows a Distributed Bragg Reflector structure 92 located between the substrate 66 and the first confining layer 70 of an improved light emitting diode 62, wherein a non-ohmic region 90a is located below the Distributed Bragg Reflector structure 92, within a lower substrate 66. FIG. 17 shows a Distributed Bragg Reflector structure 92 located between the substrate 66 and the first confining layer 70 of an improved light emitting diode 62, wherein a non-ohmic region 90b is located above the Distributed Bragg Reflector structure 92, within the first confining layer 70 of a double heterostructure 68. The preferred use of both a Distributed Bragg Reflector structure 92 and a non-ohmic region 90 provides both enhanced current blocking and enhanced light extraction from the improved light emitting diodes 62.

Alternate Surface Treatments

FIG. 18 is a partial cross-sectional view of an improved light emitting diode 62, in which a plurality of holes 60 are defined through a top conductive oxide layer, and in which a portion 53 of the conductive oxide layer 52 extends through and beyond the contact layer 80. FIG. 19 is a partial cross-sectional view of an improved light emitting diode 62, in which a plurality of holes 60 are defined through a top conductive oxide layer 52, and in which a portion 53 of the conductive oxide layer 52 that is larger than a second electrode 58 extends through and beyond the contact layer 80.

While holes 60,84 may preferably be established through both the conductive oxide layer 52 and through the contact layer 80, alternate embodiments of the improved light emitting diode 62 may preferably include holes 60 to be established only through the top oxide layer. For example, for a conductive layer 52 which absorbs much more light than the contact layer 80 (e.g. such as by materials selection or by thickness), a significant improvement in light extraction may be gained in the establishment of holes 60 defined through the conductive oxide layer 52 alone.

As well, the establishment of holes 60 through the conductive oxide layer 52 alone, or as holes 60, 84 defined through both the conductive oxide layer 52 and through a contact layer 80, may be advantageously applied to other LED structures, such as to reduce adsorption of light, or to promote selective patterning of light though the holes 60, 84 (e.g. such as for a relatively opaque conductive oxide layer 52, or for a thin metal layer).

Figure 21:
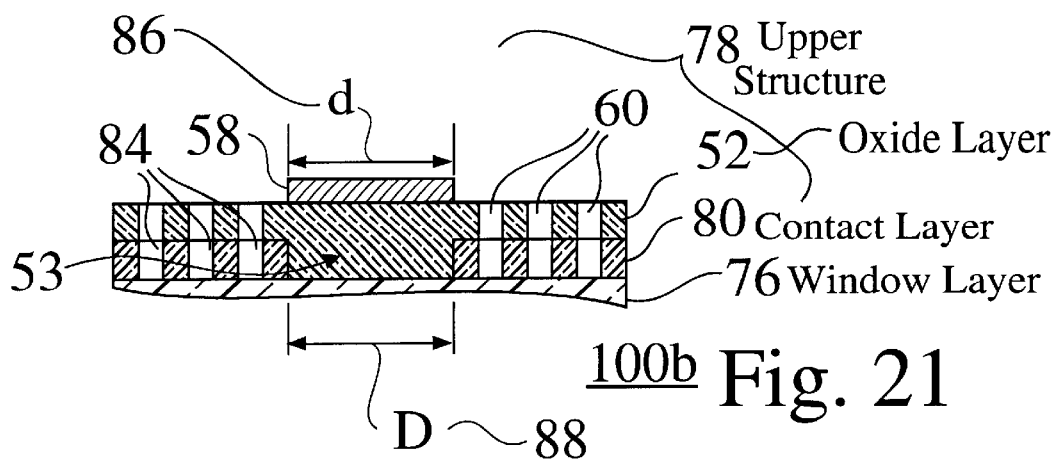
FIG. 21 is a partial cross-sectional view of an improved light emitting diode, in which a plurality of holes are defined through a top conductive oxide layer and through a contact layer, wherein a portion of the conductive oxide layer extends through the contact layer to contact the upper surface of a window layer.

FIG. 20 is a partial cross-sectional view of an improved light emitting diode 100a, in which a portion 53 of the conductive oxide layer 52 extends through the contact layer 80 to contact the upper surface 122b (FIG. 26) of a window layer 76. A plurality of holes 60 are defined through a top conductive oxide layer 52. Since the extended portion 53 of the conductive oxide layer 52 only extends to the upper surface 122b (FIG. 26) of a window layer 76, the extended portion 53 typically offers only moderate current blocking. However, the established holes 60 defined through a top conductive oxide layer 52 provide increased light extraction. Similarly, FIG. 21 is a partial cross-sectional view of the upper structure 78 of an improved light emitting diode 100b, in which a plurality of holes 60, 84 are defined through both the top conductive oxide layer 52 and the contact layer 80 respectively, to provide further light extraction.

Figure 22:
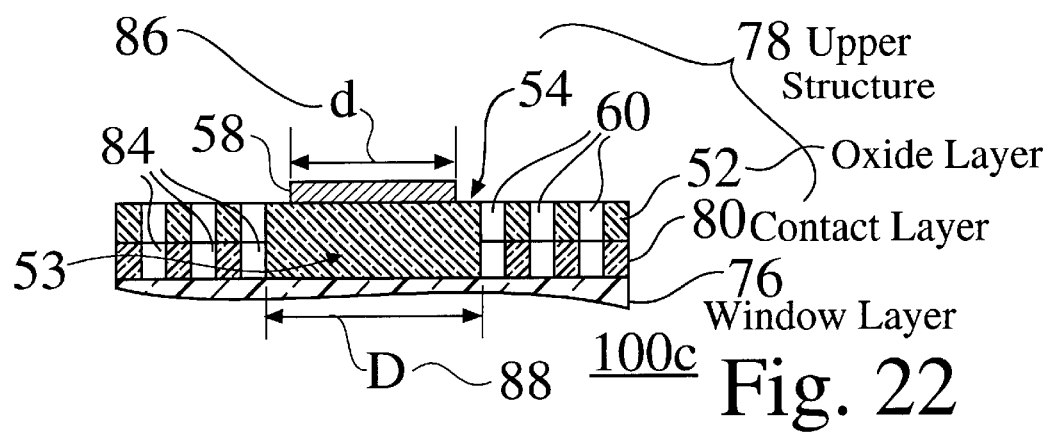
FIG. 22 is a partial cross-sectional view of an improved light emitting diode, in which a plurality of holes are defined through a top conductive oxide layer and through a contact layer, wherein a portion of the conductive oxide layer that is larger than a top electrode -extends through the contact layer to contact the upper surface of a window layer.

FIG. 22 is a partial cross-sectional view of the upper structure 78 of an improved light emitting diode 100c, in which a plurality of holes 60,84 are defined through a top conductive oxide layer 52 and through a contact layer 80 respectively, wherein a portion 53 of the conductive oxide layer 52 that is larger than a second electrode 58 extends through the contact layer 80 to contact the upper surface 122b (FIG. 26) of a window layer 76. While the extended portion 53 of the conductive oxide layer 52 only extends to the upper surface 122b of the window layer 76, the extended portion 53 typically offers only moderate current blocking. However, in FIG. 22, the size 88 of the extended portion 53 of the conductive oxide layer 52, which is similarly used for current blocking, is preferably larger than the size 86 of the second electrode 58, such that light 91 which is generated in region 89 and near the edge of the second electrode 58 can escape through the transparent oxide layer 52 in the central peripheral region 54 (FIG. 4) outside the second electrode 58.

Alternate Deep Current Blocking Structures

Figure 23:
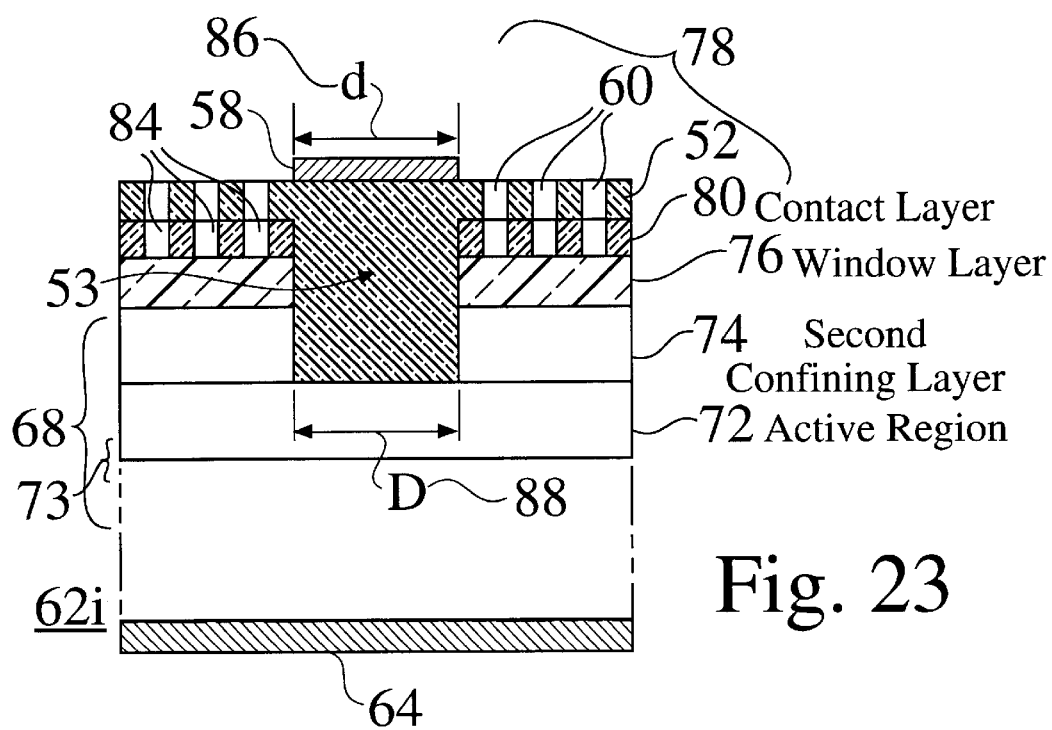
FIG. 23 is a cross-sectional view of a light emitting diode similar to the light emitting diode of FIG. 9, in which a portion 53 of the conductive oxide layer extends through the contact layer, the window layer, and the second confining layer, to contact the upper surface of the active region.
Figure 24:
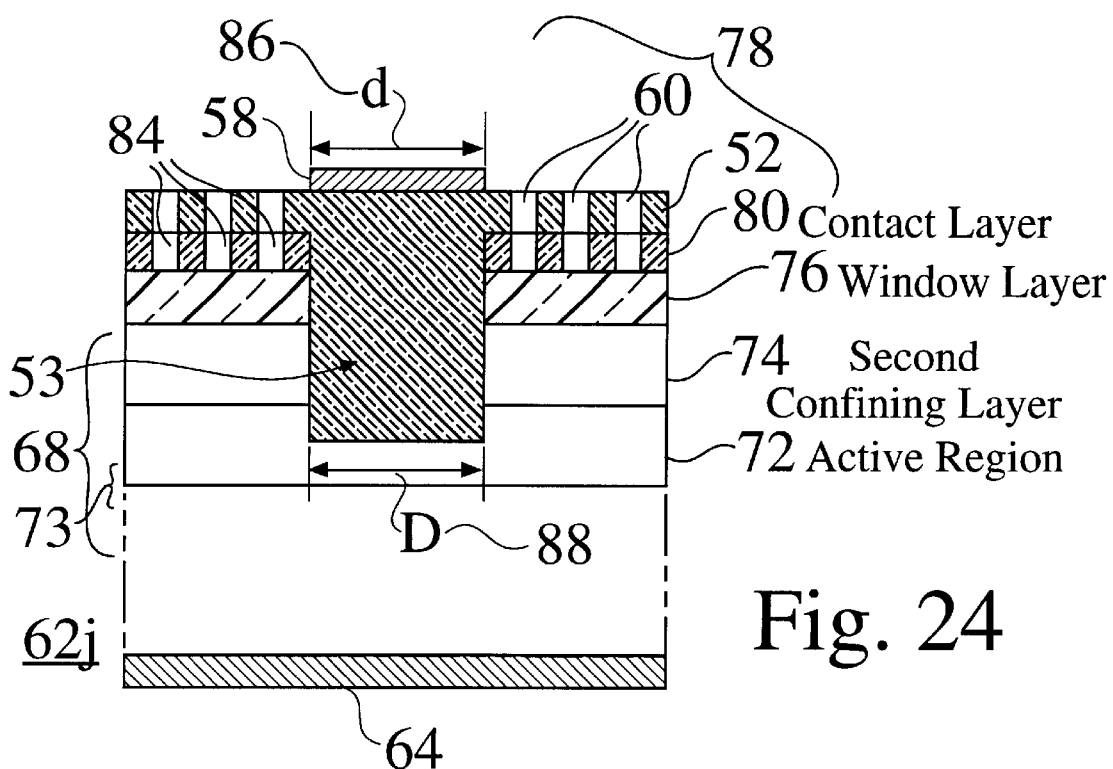
FIG. 24 is a cross-sectional view of a light emitting diode similar to the light emitting diode of FIG. 23, in which a portion of the conductive oxide layer extends through and beyond the contact layer, the window layer, and the second confining layer, and into the active region.
Figure 25:
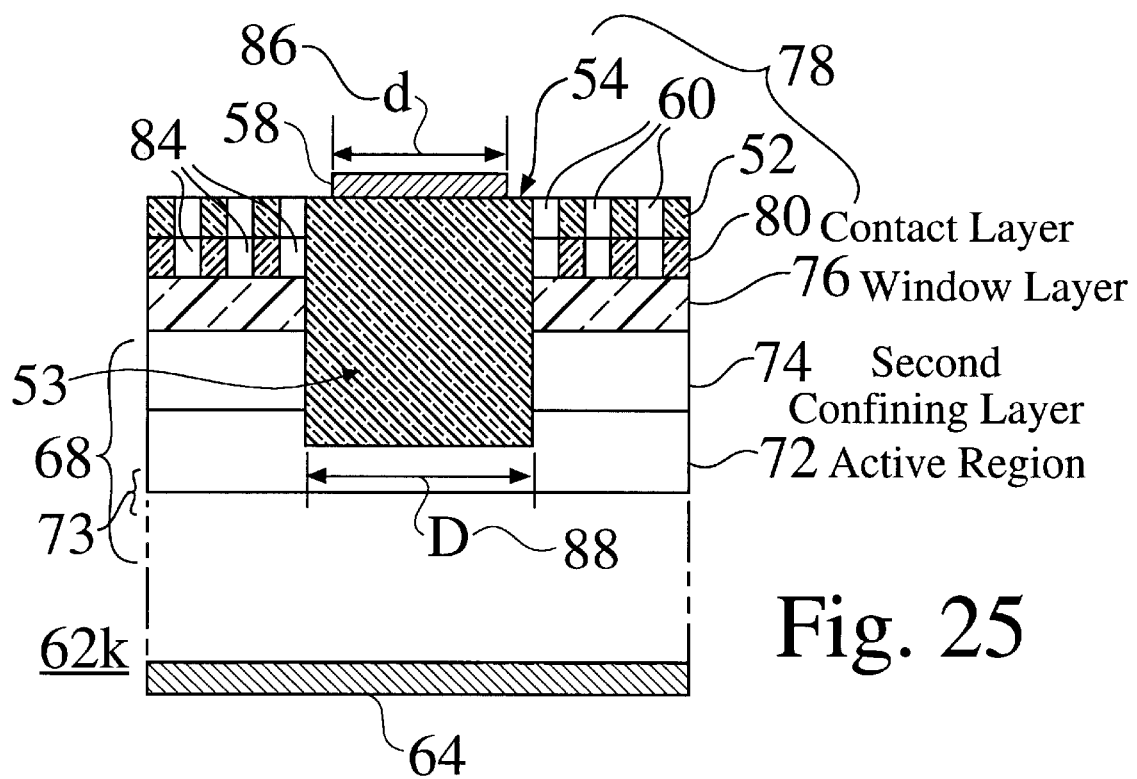
FIG. 25 is a cross-sectional view of a light emitting diode similar to the light emitting diode of FIG. 24, in which the extending portion of the conductive oxide layer is larger than the top electrode.

As described above, in alternate embodiments of the improved light emitting diodes 62, the current blocking structure 53 may extend through or even beyond the lower surface 122a (FIG. 26) of the window layer 76, typically to provide enhanced current blocking. FIG. 23 is a cross-sectional view of a light emitting diode 62i similar to the light emitting diode 62e of FIG. 9, in which a portion 53 of the conductive oxide layer 52 extends through the contact layer 80, the window layer 76, and the second confining layer 74, to contact the upper surface of the active region 72. FIG. 24 is a cross-sectional view of a light emitting diode 62j similar to the light emitting diode 62i of FIG. 23, in which a portion 53 of the conductive oxide layer 52 extends through and beyond the contact layer 80, the window layer 76, and the second confining layer 74, and into the active region 72. FIG. 25 is a cross-sectional view of a light emitting diode 62k similar to the light emitting diode 62j of FIG. 24, in which the extending portion 53 of the conductive oxide layer 52 is larger than the second electrode 58.

FIG. 26 is an expanded assembly view 102 which provides a reference to the structures of various embodiments of improved light emitting diodes 62, 100. A first electrode 64 has a lower surface 112a and an upper surface 112b. The substrate 66 has a lower surface 114a and an upper surface 114b. The first confining layer 70 has a lower surface 116a and an upper surface 116b. The active region 72 has a lower surface 118a and an upper surface 118b, and may include a hollow portion 110 (FIG. 24, FIG. 25). The second confining layer 74 has a lower surface 120a and an upper surface 120b, and may include a hollow portion 108 (FIGS. 9–12, 23–25). The window layer 76 has a lower surface 122a and an upper surface 122b, and typically includes a hollow portion 106 (FIGS. 5–12, 18–19, 23–25). The contact layer 80 has a lower surface 124a and an upper surface 124b, which includes a hollow portion 104, and preferably includes one or more holes 84. The conductive oxide layer 52 has a lower surface 126a and an upper surface 126b, and includes an extending portion 53 (which may be an integral region or a separate structure), and preferably includes one or more holes 60. The second electrode 58 is located within a central region 82 on the upper surface 126b of the conductive substrate 52.

The improved light emitting diode structures 62, 100 have a lower surface 128 and an upper surface 130.

System Advantages

The improved light emitting diodes 62 provide enhanced current spreading across the LED structure (e.g. such as by using a conductive oxide layer 52, a contact layer 80, and a window layer 76), while reducing the production of light in regions 89 of the active region 72 which are shadowed by the second electrode 58 (e.g. such as by using an extended portion 53 of the conductive oxide layer 52 to increase the blocking depth, and/or by using a lower blocking region 90a–90c).

As well, the improved light emitting diodes 62 promote the efficient production and transmission of light in regions of the active region 72 which are not shadowed by the second electrode 58, such as by providing an extended portion 53 of the conductive oxide layer 52 which is larger than the second electrode 58, by establishing one or more holes 60 in the conductive oxide layer 52, or by establishing one or more holes 60,84 through both the conductive oxide layer 52, and the contact layer 80 respectively, to minimize the absorption of light in these layers, and preferably by providing a Distributed Bragg Reflector structure 92.

The improved current blocking mechanisms provide effective current blocking, and can minimize or avoid the current crowding rings which often occur around the edge of the top electrode for light emitting diodes having conventional current blocking mechanisms.

Although the improved light emitting diode 62, 100 and its methods of use are described herein in connection with the disclosed light emitting diode structures, the systems and techniques can be implemented with other diode structures or optical devices, or any combination thereof, as desired. For example, while the upper surface 126b of the conductive oxide layer 52 is shown as a flat surface, wherein one or more holes 60 are shown extending vertically downward through the conductive oxide layer 52, the surfaces of the conductive oxide layer 52 and the contact layer 80, as well as the holes 60, 84 may include non-planar features, such as to direct, focus, or increase the transmitted light. As well, any of the various techniques of current spreading, current blocking, and improved current transmission may be advantageously applied to other light emitting diode structures.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. A light emitting diode, comprising:

a first electrode;

a substrate formed on said first electrode;

a first confining layer of a first conductivity type formed on said substrate;

an active region formed on said first confining layer;

a second confining layer of a second conductivity type formed on said active region;

a window layer of said second conductivity type formed on said second confining layer, said window layer having a hollow portion extending from the top surface of said window layer and extending into said window layer;

a contact layer of said second conductivity type formed on said window layer for making ohmic contact, said contact layer having a hollow portion extending from the top surface of said contact layer to the bottom surface of said contact layer, thereby exposing said hollow portion in said window layer;

an electrically conductive oxide layer having a lower surface and an upper surface formed on said contact layer, said electrically conductive oxide layer being at least partially transparent, said electrically conductive oxide layer having an outer region and an inner current blocking region, said inner current blocking region of said conductive oxide layer extending from said lower surface of said electrically conductive oxide layer through said hollow portion in said contact layer and into said hollow portion in said window layer, electrical resistivity of said electrically conductive oxide layer being less than electrical resistivity of said window layer and said contact layer; and a second electrode formed on a portion of said upper surface of said electrically conductive oxide layer, said second electrode being approximately aligned with said hollow portion in said contact layer and said hollow portion in said window layer.

2. The light emitting diode of claim 1, further comprising:

at least one hole defined through said outer region of said electrically conductive oxide layer.

3. The light emitting diode of claim 2, further comprising:

at least one hole defined through said contact layer and approximately aligned with each of said at least one hole defined through said outer region of said electrically conductive oxide layer.

4. The light emitting diode of claim 1, wherein the upper surface of said substrate includes a blocking region extending from the top surface of said substrate into said substrate, said blocking region approximately aligned with said inner current blocking region of said electrically conductive oxide layer, said blocking region having an electrical resistivity higher than the electrical resistivity of said substrate.

5. The light emitting diode of claim 4, wherein said blocking region comprises an oxide region.

6. The light emitting diode of claim 4, wherein said blocking region comprises a nitride region.

7. The light emitting diode of claim 1, wherein the upper surface of said substrate includes a blocking region extending from the top surface of said substrate into said substrate, said blocking region approximately aligned with said inner current blocking region of said electrically conductive oxide layer, said blocking region comprising a semiconductor of said second conductivity type.

8. The light emitting diode of claim 1, wherein said inner current blocking region of said electrically conductive oxide layer is larger than said second electrode.

9. The light emitting diode of claim 1, wherein the lower surface of said first confining layer includes a blocking region extending from said lower surface of said first confining layer into said first confining layer, said blocking region approximately aligned with said inner current blocking region of said electrically conductive oxide layer, said blocking region having an electrical resistivity higher than the electrical resistivity of said substrate.

10. The light emitting diode of claim 9, wherein said blocking region comprises an oxide region.

11. The light emitting diode of claim 9, wherein said blocking region comprises a nitride region.

12. The light emitting diode of claim 1, wherein the lower surface of said first confining layer includes a blocking region extending from said lower surface of said first confining layer into said first confining layer, said blocking region approximately aligned with said inner current blocking region of said electrically conductive oxide layer, said blocking region comprising a semiconductor of said second conductivity type.

13. The light emitting diode of claim 1, further comprising:
a distributed Bragg reflector layer of said first conductivity type having a plurality of sublayers formed on said substrate and under said first confining layer.

14. The light emitting diode of claim 13, wherein said distributed Bragg reflector layer comprises $Al_xGa_{1-x}As$, where x varies between 0 and 1.

15. The light emitting diode of claim 1, wherein said substrate comprises GaAs.

16. The light emitting diode of claim 1, wherein said first confining layer comprises $(Al_xGa_{1-x})_{1-y}In_yP$, where x may vary from 0.5 to 1, and y is approximately 0.5.

17. The light emitting diode of claim 1, wherein said active region comprises $(Al_xGa_{1-x})_{1-y}In_yP$, where x may vary from 0 to 0.4, and y is approximately 0.5.

18. The light emitting diode of claim 1, wherein said second confining layer comprises $(Al_xGa_{1-x})_{1-y}In_yP$, where x may vary from 0.5 to 1, and y is approximately 0.5.

19. The light emitting diode of claim 1, wherein said active region comprises an $(Al_xGa_{1-x})_{1-y}In_yP$ single quantum well structure, where x may vary from 0 to 0.4, and y is approximately 0.5.

20. The light emitting diode of claim 1, wherein said active region comprises an $(Al_xGa_{1-x})_{1-y}In_yP$ multiple quantum well structure, where x may vary from 0 to 0.4, and y is approximately 0.5.

21. The light emitting diode of claim 1, wherein said active region comprises an $(Al_xGa_{1-x})_{1-y}In_yP$ multiple well structure, where x may vary from 0 to 0.4, and y is approximately 0.5.

22. The light emitting diode of claim 1, wherein said window layer comprises a material chosen from the group consisting of GaP, GaAsP, AlGaAs, InGaP, AlInGaP, CdS, ZnTe, ZnS, and ZnSe.

23. The light emitting diode of claim 1, wherein said contact layer comprises a material chosen from the group consisting of GaAs, GaAsP, AlGaAs, InGaAs and InAs.

24. The light emitting diode of claim 1, wherein said electrically conductive oxide layer comprises a material chosen from the group consisting of indium oxide, tin oxide, cadmium oxide, cadmium tin oxide, and indium tin oxide, zinc oxide, and magnesium oxide.

25. The light emitting diode of claim 1, wherein said first conductivity type is an n-conductivity type, and wherein said second conductivity type is a p-conductivity type.

26. The light emitting diode of claim 1, wherein said first conductivity type is a p-conductivity type, and wherein said second conductivity type is an n-conductivity type.

27. A light emitting diode comprising:
a first electrode;
a substrate formed on said first electrode;
a first confining layer of a first conductivity type formed on said substrate;
an active region formed on said first confining layer;
a second confining layer of a second conductivity type formed on said active region;
a window layer of said second conductivity type formed on said second confining layer, said window layer having a hollow portion extending from the top surface of said window layer and extending to the bottom surface of said window layer;
a contact layer of said second conductivity type formed on said window layer for making ohmic contact, said contact layer having a hollow portion extending from the top surface of said contact layer to the bottom surface of said contact layer, thereby exposing said hollow portion in said window layer;
an electrically conductive oxide layer formed on said contact layer having an outer region, and an inner current blocking region, said inner current blocking region of said electrically conductive oxide layer extending through said hollow portion in said contact layer, and through said hollow portion in said window layer, electrical resistivity of said electrically conductive oxide layer being less than electrical resistivity of said window layer and said contact layer; and
a second electrode formed on a portion of said electrically conductive oxide layer, said second electrode being approximately aligned with said hollow portion in said contact layer and said hollow portion in said window layer.

28. The light emitting diode of claim 27, wherein said second confining layer includes a hollow portion extending from the top surface of said second confining layer, said hollow portion of said second confining layer approximately aligned with said hollow portion in said window layer, and wherein said inner current blocking region of said electrically conductive oxide layer extends into said hollow portion of said second confining layer.

29. The light emitting diode of claim 27, wherein said second confining layer includes a hollow portion extending from the top surface of said second confining layer to the bottom surface of said second confining layer, said hollow portion of said second confining layer approximately aligned with said hollow portion in said window layer, and wherein said inner current blocking region of said electrically conductive oxide layer extends into said hollow portion of said second confining layer.

30. The light emitting diode of claim 29, wherein said active region includes a hollow portion extending from the top surface of said active region, said hollow portion of said active region approximately aligned with said hollow portion in said second confining layer, and wherein said inner current blocking region of said electrically conductive oxide layer extends into said hollow portion of said active region.

31. The light emitting diode of claim 27, wherein said electrically conductive oxide layer is at least partially transparent.

32. The light emitting diode of claim 27, wherein said electrically conductive oxide layer is substantially transparent.

33. The light emitting diode of claim 27, further comprising:
at least one hole defined through said outer region of said electrically conductive oxide layer.

34. The light emitting diode of claim 33, further comprising:
at least one hole defined through said contact layer and approximately aligned with each of said at least one hole defined through said outer region of said electrically conductive oxide layer.

35. The light emitting diode of claim 27, wherein the upper surface of said substrate includes a blocking region extending from the top surface of said substrate into said substrate, said blocking region approximately aligned with said inner current blocking region of said electrically conductive oxide layer, said blocking region having an electrical resistivity higher than the electrical resistivity of said substrate.

36. The light emitting diode of claim 35, wherein said blocking region comprises an oxide region.

37. The light emitting diode of claim 35, wherein said blocking region comprises a nitride region.

38. The light emitting diode of claim 27, wherein the upper surface of said substrate includes a blocking region extending from the top surface of said substrate into said substrate, said blocking region approximately aligned with said inner current blocking region of said electrically conductive oxide layer, said blocking region comprising an semiconductor of said second conductivity type.

39. The light emitting diode of claim 27, wherein size of said inner current blocking region of said electrically conductive oxide layer is larger than size of said second electrode.

40. The light emitting diode of claim 27, wherein the lower surface of said first confining layer includes a blocking region extending from said lower surface of said first confining layer into said first confining layer, said blocking region approximately aligned with said inner current blocking region of said electrically conductive oxide layer, said blocking region having an electrical resistivity higher than the electrical resistivity of said substrate.

41. The light emitting diode of claim 40, wherein said blocking region comprises an oxide region.

42. The light emitting diode of claim 40, wherein said blocking region comprises a nitride region.

43. The light emitting diode of claim 27, wherein the lower surface of said first confining layer includes a blocking region extending from said lower surface of said first confining layer into said first confining layer, said blocking region approximately aligned with said inner region of said electrically conductive oxide layer, said blocking region comprising a semiconductor of said second conductivity type.

44. The light emitting diode of claim 27, further comprising:
a distributed Bragg reflector layer of said first conductivity type having a plurality of sublayers formed on said substrate and under said first confining layer.

45. The light emitting diode of claim 44, wherein said distributed Bragg reflector layer comprises $Al_xGa_{1-x}As$, where x varies between 0 and 1.

46. The light emitting diode of claim 27, wherein said substrate comprises GaAs.

47. The light emitting diode of claim 27, wherein said first confining layer comprises $(Al_xGa_{1-x})_{1-y}In_yP$, where x may vary from 0.5 to 1, and y is approximately 0.5.

48. The light emitting diode of claim 27, wherein said active region comprises $(Al_xGa_{1-x})_{1-y}In_yP$, where x may vary from 0 to 0.4, and y is approximately 0.5.

49. The light emitting diode of claim 27, wherein said second confining layer comprises $(Al_xGa_{1-x})_{1-y}In_yP$, where x may vary from 0.5 to 1, and y is approximately 0.5.

50. The light emitting diode of claim 27, wherein said active region comprises an $(Al_xGa_{1-x})_{1-y}In_yP$ single quantum well structure, where x may vary from 0 to 0.4, and y is approximately 0.5.

51. The light emitting diode of claim 27, wherein said active region comprises an $(Al_xGa_{1-x})_{1-y}In_yP$ multiple quantum well structure, where x may vary from 0 to 0.4, and y is approximately 0.5.

52. The light emitting diode of claim 27, wherein said active region comprises an $(Al_xGa_{1-x})_{1-y}In_yP$ multiple well structure, where x may vary from 0 to 0.4, and y is approximately 0.5.

53. The light emitting diode of claim 27, wherein said window layer comprises a material chosen from the group consisting of GaP, GaAsP, AlGaAs, InGaP, AlInGaP, CdS, ZnTe, ZnS, and ZnSe.

54. The light emitting diode of claim 27, wherein said contact layer comprises a material chosen from the group consisting of GaAs, GaAsP, AlGaAs, InGaAs and InAs.

55. The light emitting diode of claim 27, wherein said electrically conductive oxide layer comprises a material chosen from the group consisting of indium oxide, tin oxide, cadmium oxide, cadmium tin oxide, and indium tin oxide, zinc oxide, and magnesium oxide.

56. The light emitting diode of claim 27, wherein said first conductivity type is an n-conductivity type, and wherein said second conductivity type is a p-conductivity type.

57. The light emitting diode of claim 27, wherein said first conductivity type is a p-conductivity type, and wherein said second conductivity type is an n-conductivity type.

* * * * *